(12) United States Patent
Adib et al.

(10) Patent No.: US 11,192,340 B2
(45) Date of Patent: Dec. 7, 2021

(54) DEVICE MODIFIED SUBSTRATE ARTICLE AND METHODS FOR MAKING

(71) Applicant: CORNING INCORPORATED, Corning, NY (US)

(72) Inventors: Kaveh Adib, Corning, NY (US); Robert Alan Bellman, Ithaca, NY (US); Robert George Manley, Vestal, NY (US); Prantik Mazumder, Ithaca, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/732,845

(22) Filed: Jan. 2, 2020

(65) Prior Publication Data
US 2020/0139677 A1    May 7, 2020

Related U.S. Application Data

(63) Continuation of application No. 15/302,098, filed as application No. PCT/US2015/024600 on Apr. 7, 2015, now Pat. No. 10,543,662.
(Continued)

(51) Int. Cl.
*B32B 17/06* (2006.01)
*B32B 3/26* (2006.01)
(Continued)

(52) U.S. Cl.
CPC .............. *B32B 17/06* (2013.01); *B32B 3/266* (2013.01); *B32B 7/06* (2013.01); *B32B 7/12* (2013.01);
(Continued)

(58) Field of Classification Search
CPC ........... B32B 17/06; B32B 7/12; B32B 9/005; B32B 17/00; B32B 9/04; B32B 7/06; B32B 3/266; B32B 27/06
(Continued)

(56) References Cited

U.S. PATENT DOCUMENTS

| 3,722,181 A | 3/1973 | Kirkland et al. |
| 4,096,315 A | 6/1978 | Kubacki |

(Continued)

FOREIGN PATENT DOCUMENTS

| CN | 101924067 A | 12/2010 |
| CN | 102034746 A | 4/2011 |

(Continued)

OTHER PUBLICATIONS

ISR from PCT/US2015/013017.
(Continued)

*Primary Examiner* — Tahseen Khan

(57) ABSTRACT

A method of making a device substrate article having a device modified substrate supported on a glass carrier substrate, including:
  treating at least a portion of the first surface of a device substrate, at least a portion of a first surface of a glass carrier, or a combination thereof, wherein the treating produces a surface having:
    silicon; oxygen; carbon; and fluorine amounts; and a metal to fluorine ratio as defined herein;
  contacting the treated surface with an untreated or like-treated counterpart device substrate or glass carrier substrate to form a laminate comprised of the device substrate bonded to the glass carrier substrate;
  modifying at least a portion of the non-bonded second surface of the device substrate of the laminate with at least one device surface modification treatment; and
(Continued)

separating the device substrate having the device modified second surface from the glass carrier substrate.

4 Claims, 7 Drawing Sheets

Related U.S. Application Data

(60) Provisional application No. 61/977,364, filed on Apr. 9, 2014.

(51) Int. Cl.
| | |
|---|---|
| *B32B 7/06* | (2019.01) |
| *B32B 7/12* | (2006.01) |
| *B32B 9/00* | (2006.01) |
| *B32B 9/04* | (2006.01) |
| *B32B 17/00* | (2006.01) |
| *B32B 27/06* | (2006.01) |
| *B32B 38/00* | (2006.01) |
| *C03C 15/00* | (2006.01) |
| *H01L 21/02* | (2006.01) |

(52) U.S. Cl.
CPC .............. *B32B 9/005* (2013.01); *B32B 9/04* (2013.01); *B32B 17/00* (2013.01); *B32B 27/06* (2013.01); *B32B 38/0008* (2013.01); *B32B 2250/02* (2013.01); *B32B 2255/00* (2013.01); *B32B 2307/308* (2013.01); *B32B 2307/50* (2013.01); *B32B 2307/546* (2013.01); *B32B 2307/702* (2013.01); *B32B 2307/732* (2013.01); *B32B 2307/748* (2013.01); *B32B 2307/75* (2013.01); *B32B 2309/02* (2013.01); *B32B 2309/04* (2013.01); *B32B 2309/105* (2013.01); *B32B 2315/08* (2013.01); *B32B 2457/00* (2013.01); *C03C 15/00* (2013.01); *H01L 21/02043* (2013.01); *H01L 21/02079* (2013.01)

(58) Field of Classification Search
USPC ....................................................... 428/131
See application file for complete search history.

(56) References Cited

U.S. PATENT DOCUMENTS

| | | | |
|---|---|---|---|
| 4,179,324 | A | 12/1979 | Kirkpatrick |
| 4,397,722 | A | 8/1983 | Haller |
| 4,599,243 | A | 7/1986 | Sachdev et al. |
| 4,810,326 | A | 3/1989 | Babu et al. |
| 4,822,466 | A | 4/1989 | Rabalais et al. |
| 4,849,284 | A | 7/1989 | Arthur et al. |
| 4,990,462 | A | 2/1991 | Sliwa, Jr. |
| 5,073,181 | A | 12/1991 | Foster et al. |
| 5,141,800 | A | 8/1992 | Effenberger et al. |
| 5,222,494 | A | 6/1993 | Baker, Jr. |
| 5,357,726 | A | 10/1994 | Effenberger et al. |
| 5,413,940 | A | 5/1995 | Lin et al. |
| 5,462,781 | A | 10/1995 | Zukowski |
| 5,479,043 | A | 12/1995 | Nuyen |
| 5,482,896 | A | 1/1996 | Tang |
| 5,491,571 | A | 2/1996 | Williams et al. |
| 5,554,680 | A | 9/1996 | Ojakaar |
| 5,616,179 | A | 4/1997 | Baldwin et al. |
| 5,661,618 | A | 8/1997 | Brown et al. |
| 5,718,967 | A | 2/1998 | Hu et al. |
| 5,755,867 | A | 5/1998 | Chikuni et al. |
| 5,820,991 | A | 10/1998 | Cabo |
| 5,840,616 | A | 11/1998 | Sakaguchi et al. |
| 5,888,591 | A | 3/1999 | Gleason et al. |
| 5,904,791 | A | 5/1999 | Bearinger et al. |
| 5,966,622 | A | 10/1999 | Levine et al. |
| 5,972,152 | A | 10/1999 | Lake et al. |
| 6,037,026 | A | 3/2000 | Iwamoto |
| 6,091,478 | A | 7/2000 | Tanaka et al. |
| 6,124,154 | A | 9/2000 | Miyasaka |
| 6,159,385 | A | 12/2000 | Yao et al. |
| 6,261,398 | B1 | 7/2001 | Costa |
| 6,338,901 | B1 | 1/2002 | Veerasamy |
| 6,379,746 | B1 | 4/2002 | Birch et al. |
| 6,387,736 | B1 | 5/2002 | Cao et al. |
| 6,521,511 | B1 | 2/2003 | Inoue et al. |
| 6,521,857 | B1 | 2/2003 | Barnett |
| 6,528,145 | B1 | 3/2003 | Berger et al. |
| 6,540,866 | B1 | 4/2003 | Zhang et al. |
| 6,602,606 | B1 | 8/2003 | Fujisawa et al. |
| 6,645,828 | B1 | 11/2003 | Farrens et al. |
| 6,649,540 | B2 | 11/2003 | Wang et al. |
| 6,687,969 | B1 | 2/2004 | Dando |
| 6,699,798 | B2 | 3/2004 | Rockford |
| 6,735,982 | B2 | 5/2004 | Matthies |
| 6,762,074 | B1 | 7/2004 | Draney et al. |
| 6,814,833 | B2 | 11/2004 | Sabia |
| 6,815,070 | B1 | 11/2004 | Burkle et al. |
| 6,969,166 | B2 | 11/2005 | Clark et al. |
| 6,974,731 | B2 | 12/2005 | Yamazaki et al. |
| 6,992,371 | B2 | 1/2006 | Mancini et al. |
| 7,041,608 | B2 | 5/2006 | Sieber et al. |
| 7,045,878 | B2 | 5/2006 | Faris |
| 7,056,751 | B2 | 6/2006 | Faris |
| 7,060,323 | B2 | 6/2006 | Sugahara et al. |
| 7,118,990 | B1 | 10/2006 | Xu et al. |
| 7,129,311 | B2 | 10/2006 | Teff et al. |
| 7,144,638 | B2 | 12/2006 | Leung et al. |
| 7,147,740 | B2 | 12/2006 | Takayama et al. |
| 7,166,520 | B1 | 1/2007 | Henley |
| 7,220,656 | B2 | 5/2007 | Forbes |
| 7,232,739 | B2 | 6/2007 | Kerdiles et al. |
| 7,261,793 | B2 | 8/2007 | Chen et al. |
| 7,351,300 | B2 | 4/2008 | Takayama et al. |
| 7,364,942 | B2 | 4/2008 | Martin |
| 7,407,867 | B2 | 8/2008 | Ghyselen et al. |
| 7,408,006 | B2 | 8/2008 | Comino et al. |
| 7,466,390 | B2 | 12/2008 | French et al. |
| 7,482,249 | B2 | 1/2009 | Jakob et al. |
| 7,531,590 | B2 | 5/2009 | Teff et al. |
| 7,541,264 | B2 | 6/2009 | Gardner et al. |
| 7,574,787 | B2 | 8/2009 | Xu et al. |
| 7,575,983 | B2 | 8/2009 | Hu et al. |
| 7,635,617 | B2 | 12/2009 | Yamazaki |
| 7,642,559 | B2 | 1/2010 | Yamazaki et al. |
| 7,737,035 | B1 | 6/2010 | Lind et al. |
| 7,741,775 | B2 | 6/2010 | Yamazaki et al. |
| 7,749,862 | B2 | 7/2010 | Schwarzenbach et al. |
| 7,763,365 | B2 | 7/2010 | Takeuchi et al. |
| 7,842,548 | B2 | 11/2010 | Lee et al. |
| 7,902,038 | B2 | 3/2011 | Aspar et al. |
| 7,909,928 | B2 | 3/2011 | Lahann et al. |
| 7,939,425 | B2 | 5/2011 | Hu et al. |
| 7,960,840 | B2 | 6/2011 | Bonifield et al. |
| 7,960,916 | B2 | 6/2011 | Kawachi |
| 7,978,282 | B2 | 7/2011 | An et al. |
| 7,989,314 | B2 | 8/2011 | Lee et al. |
| 8,012,667 | B2 | 9/2011 | Nam et al. |
| 8,034,206 | B2 | 10/2011 | Kim et al. |
| 8,034,452 | B2 | 10/2011 | Padiyath et al. |
| 8,043,697 | B2 | 10/2011 | Murakami et al. |
| 8,048,794 | B2 | 11/2011 | Knickerbocker |
| 8,069,229 | B2 | 11/2011 | Yellapragada et al. |
| 8,105,935 | B2 | 1/2012 | Ohara et al. |
| 8,138,614 | B2 | 3/2012 | Yamazaki et al. |
| 8,173,249 | B2 | 5/2012 | Leu et al. |
| 8,211,259 | B2 | 7/2012 | Sato et al. |
| 8,211,270 | B2 | 7/2012 | Suzuki et al. |
| 8,236,669 | B2 | 8/2012 | Hong et al. |
| 8,268,939 | B2 | 9/2012 | Ebbrecht et al. |
| 8,349,727 | B2 | 1/2013 | Guo et al. |
| 8,383,460 | B1 | 2/2013 | Yim |
| 8,399,047 | B2 | 3/2013 | Lahann et al. |
| 8,580,069 | B2 | 11/2013 | Watanabe et al. |
| 8,590,688 | B2 | 11/2013 | Weigl |

(56) References Cited

U.S. PATENT DOCUMENTS

| | | |
|---|---|---|
| 8,609,229 B2 | 12/2013 | Kondo |
| 8,656,735 B2 | 2/2014 | Tamitsuji et al. |
| 8,660,052 B2 | 2/2014 | Liang et al. |
| 8,697,228 B2 | 4/2014 | Carre et al. |
| 8,697,728 B2 | 4/2014 | Ashrafian et al. |
| 8,822,306 B2 | 9/2014 | Berger et al. |
| 8,840,999 B2 | 9/2014 | Harimoto et al. |
| 8,993,706 B2 | 3/2015 | Schubert et al. |
| 8,995,146 B2 | 3/2015 | Brooks et al. |
| 9,069,133 B2 | 6/2015 | Baldwin et al. |
| 9,131,587 B2 | 6/2015 | Zhou |
| 9,111,981 B2 | 8/2015 | Flaim et al. |
| 9,269,826 B2 | 2/2016 | Hosono et al. |
| 9,612,455 B2 | 4/2017 | Nicolson et al. |
| 9,805,941 B2 | 10/2017 | Kanarik et al. |
| 9,889,635 B2 | 2/2018 | Bellman et al. |
| 10,046,542 B2 | 8/2018 | Adib et al. |
| 10,086,584 B2 | 10/2018 | Bellman et al. |
| 10,543,662 B2 * | 1/2020 | Bellman ............... B32B 17/00 |
| 2001/0045351 A1 | 11/2001 | Koh et al. |
| 2002/0171080 A1 | 11/2002 | Faris |
| 2003/0017303 A1 | 1/2003 | Shindo et al. |
| 2003/0020049 A1 | 1/2003 | Payne et al. |
| 2003/0020062 A1 | 1/2003 | Faris |
| 2003/0057563 A1 | 3/2003 | Nathan et al. |
| 2003/0119336 A1 | 6/2003 | Matsuki et al. |
| 2003/0175525 A1 | 9/2003 | Wochnowski et al. |
| 2003/0210853 A1 | 11/2003 | Kato |
| 2003/0228413 A1 | 12/2003 | Ohta et al. |
| 2004/0033358 A1 | 2/2004 | Coates et al. |
| 2004/0044100 A1 | 3/2004 | Schlenoff et al. |
| 2004/0217352 A1 | 11/2004 | Forbes |
| 2004/0222500 A1 | 11/2004 | Aspar et al. |
| 2004/0247949 A1 | 12/2004 | Akedo |
| 2004/0248378 A1 | 12/2004 | Ghyselen et al. |
| 2004/0258850 A1 | 12/2004 | Straccia et al. |
| 2005/0001201 A1 | 1/2005 | Bocko et al. |
| 2005/0029224 A1 | 2/2005 | Aspar et al. |
| 2005/0059218 A1 | 3/2005 | Faris |
| 2005/0069713 A1 | 3/2005 | Gupta et al. |
| 2005/0081993 A1 | 4/2005 | Ilkka et al. |
| 2005/0118595 A1 | 6/2005 | Lahann |
| 2005/0118742 A1 | 6/2005 | Henning et al. |
| 2005/0136188 A1 | 6/2005 | Chang |
| 2005/0175851 A1 | 8/2005 | Bordunov et al. |
| 2005/0224155 A1 | 10/2005 | Chen et al. |
| 2005/0242341 A1 | 11/2005 | Knudson et al. |
| 2006/0091104 A1 | 5/2006 | Takeshita et al. |
| 2006/0134362 A1 | 6/2006 | Lu et al. |
| 2006/0165975 A1 | 7/2006 | Moser et al. |
| 2006/0166464 A1 | 7/2006 | Jakob et al. |
| 2006/0192205 A1 | 8/2006 | Yamazaki et al. |
| 2006/0246218 A1 | 11/2006 | Bienkiewicz et al. |
| 2006/0250559 A1 | 11/2006 | Bocko et al. |
| 2006/0264004 A1 | 11/2006 | Tong et al. |
| 2007/0048530 A1 | 3/2007 | Tsao et al. |
| 2007/0077353 A1 | 4/2007 | Lee et al. |
| 2007/0077728 A1 | 4/2007 | Kulkarni et al. |
| 2007/0077782 A1 | 4/2007 | Lee et al. |
| 2007/0091062 A1 | 4/2007 | French et al. |
| 2007/0105252 A1 | 5/2007 | Lee et al. |
| 2007/0105339 A1 | 5/2007 | Faris |
| 2007/0111391 A1 | 5/2007 | Aoki et al. |
| 2007/0134784 A1 | 6/2007 | Halverson et al. |
| 2007/0181938 A1 | 8/2007 | Bucher et al. |
| 2007/0248809 A1 | 10/2007 | Haldeman et al. |
| 2008/0044588 A1 | 2/2008 | Sakhrani |
| 2008/0053959 A1 | 3/2008 | Tong et al. |
| 2008/0090380 A1 | 4/2008 | Gardner et al. |
| 2008/0111786 A1 | 5/2008 | Goudarzi |
| 2008/0135175 A1 | 6/2008 | Higuchi |
| 2008/0173992 A1 | 7/2008 | Mahler et al. |
| 2008/0212000 A1 | 9/2008 | French et al. |
| 2008/0309867 A1 * | 12/2008 | Kampstra ............... H01L 51/003 349/158 |
| 2009/0020414 A1 | 1/2009 | Tsao et al. |
| 2009/0091025 A1 | 4/2009 | Wong et al. |
| 2009/0110882 A1 * | 4/2009 | Higuchi ................... B32B 7/06 428/138 |
| 2009/0126404 A1 | 5/2009 | Sakhrani et al. |
| 2009/0133820 A1 | 5/2009 | Sato et al. |
| 2009/0218560 A1 | 9/2009 | Flaim et al. |
| 2009/0227074 A1 | 9/2009 | Hong et al. |
| 2009/0261062 A1 | 10/2009 | Kim |
| 2009/0262294 A9 | 10/2009 | Templier et al. |
| 2009/0266471 A1 | 10/2009 | Kim et al. |
| 2009/0321005 A1 | 12/2009 | Higuchi et al. |
| 2010/0018505 A1 | 1/2010 | Ma et al. |
| 2010/0038023 A1 | 2/2010 | Kho et al. |
| 2010/0089096 A1 * | 4/2010 | Tamitsuji ............... C03C 21/007 65/30.13 |
| 2010/0101719 A1 | 4/2010 | Otsuka et al. |
| 2010/0151231 A1 | 6/2010 | Matsuo et al. |
| 2010/0187980 A1 | 7/2010 | Langer et al. |
| 2010/0224320 A1 | 9/2010 | Tsai et al. |
| 2010/0308014 A1 | 12/2010 | Cheshire |
| 2010/0316871 A1 | 12/2010 | Fujiwara et al. |
| 2011/0001251 A1 | 1/2011 | Gou et al. |
| 2011/0002636 A1 | 1/2011 | Ando et al. |
| 2011/0010905 A1 | 1/2011 | Sturzebecher |
| 2011/0012873 A1 | 1/2011 | Prest et al. |
| 2011/0024166 A1 | 2/2011 | Chang et al. |
| 2011/0026236 A1 | 2/2011 | Kondo et al. |
| 2011/0042649 A1 | 2/2011 | Duvall et al. |
| 2011/0045239 A1 | 2/2011 | Takaya et al. |
| 2011/0048611 A1 | 3/2011 | Carre et al. |
| 2011/0064953 A1 | 3/2011 | O'Rourke et al. |
| 2011/0069467 A1 | 3/2011 | Flaim et al. |
| 2011/0092006 A1 | 4/2011 | An et al. |
| 2011/0102346 A1 | 5/2011 | Orsley et al. |
| 2011/0111194 A1 | 5/2011 | Carre et al. |
| 2011/0123787 A1 | 5/2011 | Tomamoto et al. |
| 2011/0170991 A1 | 7/2011 | Weigl |
| 2011/0207328 A1 | 8/2011 | Speakman |
| 2011/0227086 A1 | 9/2011 | French |
| 2011/0250427 A1 | 10/2011 | Kotov et al. |
| 2011/0256385 A1 | 10/2011 | Matsuzaki et al. |
| 2011/0272090 A1 | 11/2011 | Higuchi |
| 2011/0304794 A1 | 12/2011 | Noh et al. |
| 2011/0308739 A1 | 12/2011 | McCutcheon et al. |
| 2011/0311789 A1 | 12/2011 | Loy et al. |
| 2011/0318544 A1 | 12/2011 | Chen et al. |
| 2011/0318589 A1 | 12/2011 | Pignatelli et al. |
| 2012/0009703 A1 | 1/2012 | Feinstein et al. |
| 2012/0034437 A1 | 2/2012 | Puligadda et al. |
| 2012/0035309 A1 | 2/2012 | Zhu et al. |
| 2012/0045611 A1 | 2/2012 | Shih et al. |
| 2012/0052654 A1 | 3/2012 | Yang et al. |
| 2012/0061881 A1 | 3/2012 | Bae et al. |
| 2012/0063952 A1 | 3/2012 | Hong et al. |
| 2012/0080403 A1 | 4/2012 | Tomamoto et al. |
| 2012/0083098 A1 | 4/2012 | Berger et al. |
| 2012/0107978 A1 | 5/2012 | Shin et al. |
| 2012/0118478 A1 | 5/2012 | Park et al. |
| 2012/0132885 A1 | 5/2012 | Lippert et al. |
| 2012/0135187 A1 | 5/2012 | Takimoto et al. |
| 2012/0153496 A1 | 6/2012 | Lee et al. |
| 2012/0156457 A1 | 6/2012 | Kondo |
| 2012/0156480 A1 | 6/2012 | Kondo et al. |
| 2012/0171454 A1 | 7/2012 | Kondo |
| 2012/0193029 A1 | 8/2012 | Fay et al. |
| 2012/0202010 A1 | 8/2012 | Uchida |
| 2012/0202030 A1 | 8/2012 | Kondo et al. |
| 2012/0223049 A1 | 9/2012 | Yoshikawa et al. |
| 2012/0228617 A1 | 9/2012 | Ko et al. |
| 2012/0235315 A1 | 9/2012 | Wu et al. |
| 2012/0258320 A1 | 10/2012 | Berger |
| 2012/0272800 A1 | 11/2012 | Lacan et al. |
| 2012/0276689 A1 | 11/2012 | Canale et al. |
| 2012/0315470 A1 | 12/2012 | Hanaki et al. |
| 2012/0329249 A1 | 12/2012 | Ahn et al. |
| 2013/0037960 A1 | 2/2013 | Sadaka et al. |
| 2013/0115441 A1 | 5/2013 | Bookbinder et al. |
| 2013/0188324 A1 | 7/2013 | Lee et al. |

(56) References Cited

U.S. PATENT DOCUMENTS

| | | |
|---|---|---|
| 2013/0192574 A1 | 8/2013 | Maeda |
| 2013/0192754 A1 | 8/2013 | Dukkipati et al. |
| 2013/0203265 A1 | 8/2013 | Hsiao |
| 2013/0209731 A1 | 8/2013 | Nattermann et al. |
| 2013/0230265 A1 | 9/2013 | Hubbard et al. |
| 2013/0239617 A1 | 9/2013 | Dannoux |
| 2013/0270533 A1 | 10/2013 | Crispin et al. |
| 2013/0280495 A1 | 10/2013 | Matsumoto |
| 2014/0050911 A1 | 2/2014 | Mauro et al. |
| 2014/0106141 A1 | 4/2014 | Bellman et al. |
| 2014/0106150 A1 | 4/2014 | Decker et al. |
| 2014/0130969 A1 | 5/2014 | McCutcheon et al. |
| 2014/0150244 A1 | 6/2014 | Liu et al. |
| 2014/0165654 A1 | 6/2014 | Bellman et al. |
| 2014/0166199 A1* | 6/2014 | Bellman ............ H01L 51/0097 156/250 |
| 2014/0170378 A1* | 6/2014 | Bellman ................ C03C 27/06 428/141 |
| 2014/0210075 A1 | 7/2014 | Lee et al. |
| 2014/0220327 A1* | 8/2014 | Adib .................... C03C 17/3452 428/217 |
| 2014/0295590 A1 | 10/2014 | Oh et al. |
| 2015/0060869 A1 | 3/2015 | Ro et al. |
| 2015/0060870 A1 | 3/2015 | Ro et al. |
| 2015/0086794 A1* | 3/2015 | Akita .................... C03C 17/225 428/427 |
| 2015/0099110 A1 | 4/2015 | Bellman et al. |
| 2015/0102498 A1 | 4/2015 | Enicks et al. |
| 2015/0266276 A1 | 9/2015 | Vissing et al. |
| 2015/0306847 A1 | 10/2015 | Bellman et al. |
| 2015/0329415 A1 | 11/2015 | Bellman et al. |
| 2016/0009958 A1 | 1/2016 | Moore et al. |
| 2016/0017196 A1 | 1/2016 | Moore et al. |
| 2016/0035764 A1 | 2/2016 | Watts |
| 2016/0083835 A1* | 3/2016 | Adib ...................... C23C 16/36 428/332 |
| 2016/0211803 A1 | 7/2016 | Ji et al. |
| 2016/0329415 A1 | 11/2016 | He et al. |
| 2017/0036419 A1* | 2/2017 | Adib ........................ B32B 7/02 |
| 2017/0182744 A1* | 6/2017 | Bellman ............ B32B 38/0008 |
| 2017/0320771 A1* | 11/2017 | Adib .................... C03C 17/245 |
| 2018/0126705 A1* | 5/2018 | Adib ................ B32B 17/10036 |
| 2018/0269071 A1 | 9/2018 | Le et al. |
| 2018/0297324 A1 | 10/2018 | Adib et al. |

FOREIGN PATENT DOCUMENTS

| | | |
|---|---|---|
| CN | 102070120 A | 5/2011 |
| CN | 101916022 B | 10/2012 |
| CN | 102789125 A | 11/2012 |
| CN | 102815052 A | 12/2012 |
| CN | 102820262 A | 12/2012 |
| CN | 103042803 A | 4/2013 |
| DE | 10034737 A1 | 2/2002 |
| DE | 10323303 A1 | 4/2004 |
| DE | 10323304 A1 | 4/2004 |
| DE | 10353530 A1 | 6/2005 |
| EP | 0737258 A1 | 10/1996 |
| EP | 1628339 A1 | 2/2006 |
| EP | 1914066 A1 | 4/2008 |
| EP | 2025650 A1 | 2/2009 |
| EP | 2128105 A1 | 12/2009 |
| EP | 2270865 A2 | 1/2011 |
| EP | 2273475 A1 | 1/2011 |
| EP | 2398040 A1 | 12/2011 |
| EP | 2331436 B1 | 12/2012 |
| FR | 2893750 A1 | 5/2007 |
| GB | 1082116 A | 9/1967 |
| GB | 1373359 A | 11/1974 |
| GB | 1373559 A | 11/1974 |
| GB | 1583544 A | 1/1981 |
| GB | 2481187 A | 12/2011 |
| IN | 200906585 P1 | 5/2012 |
| JP | 1993096235 A | 4/1993 |
| JP | 05-111620 A | 5/1993 |
| JP | 2000241804 A | 9/2000 |
| JP | 2002348150 A | 12/2002 |
| JP | 2003071937 A | 3/2003 |
| JP | 2003077187 A | 3/2003 |
| JP | 2004-066664 A | 3/2004 |
| JP | 2004178891 A | 6/2004 |
| JP | 2005014599 A | 1/2005 |
| JP | 2005300972 A | 10/2005 |
| JP | 2006003684 A | 1/2006 |
| JP | 2007138144 A | 6/2007 |
| JP | 4036018 B2 | 1/2008 |
| JP | 2008072087 A | 3/2008 |
| JP | 2008123948 A | 5/2008 |
| JP | 2009028922 A | 2/2009 |
| JP | 2009028923 A | 2/2009 |
| JP | 2009074002 A | 4/2009 |
| JP | 2009-131732 A | 6/2009 |
| JP | 2009184172 A | 8/2009 |
| JP | 2009283155 A | 12/2009 |
| JP | 2010018505 A | 1/2010 |
| JP | 2010167484 A | 8/2010 |
| JP | 2010-248011 A | 11/2010 |
| JP | 4625913 B2 | 2/2011 |
| JP | 2011-048979 A | 3/2011 |
| JP | 2011-058579 A | 3/2011 |
| JP | 2011-159697 A | 8/2011 |
| JP | 2011201976 A | 10/2011 |
| JP | 2011201977 A | 10/2011 |
| JP | 2011235532 A | 11/2011 |
| JP | 2011235556 A | 11/2011 |
| JP | 2011236349 A | 11/2011 |
| JP | 2011-248011 A | 12/2011 |
| JP | 2012-035532 A | 2/2012 |
| JP | 2012030424 A | 2/2012 |
| JP | 2012-119611 A | 6/2012 |
| JP | 2012-166999 A | 9/2012 |
| JP | 5057657 B2 | 10/2012 |
| JP | 2012209545 A | 10/2012 |
| JP | 2012-212939 A | 11/2012 |
| JP | 2012-227310 A | 11/2012 |
| JP | 2012-248011 A | 12/2012 |
| JP | 5111620 B2 | 1/2013 |
| JP | 2013010340 A | 1/2013 |
| JP | 2013010342 A | 1/2013 |
| JP | 2013184346 A | 9/2013 |
| JP | 2013184872 A | 9/2013 |
| JP | 2013-224475 A | 10/2013 |
| JP | 2013207084 A | 10/2013 |
| JP | 2014019597 A | 2/2014 |
| JP | 2015093405 A | 5/2015 |
| JP | 2015093795 A | 5/2015 |
| JP | 2015116694 A | 6/2015 |
| JP | 2015-209471 A | 11/2015 |
| JP | 2016-106047 A | 6/2016 |
| JP | 2017-500259 A | 1/2017 |
| JP | 2017-500753 A | 1/2017 |
| JP | 2017-087417 A | 5/2017 |
| KR | 10-2008-0096372 A | 10/2008 |
| KR | 2008113576 A | 12/2008 |
| KR | 10-2009-0114195 A | 11/2009 |
| KR | 10-2010-0051499 A | 5/2010 |
| KR | 10-2010-0057521 A | 5/2010 |
| KR | 10-2010-0112628 A | 10/2010 |
| KR | 10-1002936 B1 | 12/2010 |
| KR | 10-2011-0033284 A | 3/2011 |
| KR | 10-2011-0043376 A | 4/2011 |
| KR | 20110045136 A | 5/2011 |
| KR | 10-2011-0068352 A | 6/2011 |
| KR | 10-1073032 B1 | 10/2011 |
| KR | 10-2011-0134708 A | 12/2011 |
| KR | 10-2012-0023063 A | 3/2012 |
| KR | 10-2012-0033284 A | 4/2012 |
| KR | 2012031698 A | 4/2012 |
| KR | 10-2012-0057346 A | 6/2012 |
| KR | 10-2012-0064676 A | 6/2012 |
| KR | 10-2012-0069608 A | 6/2012 |
| KR | 20120056227 A | 6/2012 |
| KR | 10-1164945 B1 | 7/2012 |

(56) References Cited

FOREIGN PATENT DOCUMENTS

| | | |
|---|---|---|
| KR | 10-2012-0098640 A | 9/2012 |
| KR | 20120100274 A | 9/2012 |
| KR | 2013003997 A | 1/2013 |
| KR | 2013044774 A | 5/2013 |
| KR | 20130095605 A | 8/2013 |
| KR | 2013104534 A | 9/2013 |
| KR | 10-2015-0038177 A | 4/2015 |
| KR | 10-1522941 B1 | 6/2015 |
| TW | 201315593 A | 4/2013 |
| TW | 201332768 A | 8/2013 |
| TW | 201442968 A | 11/2014 |
| TW | 201545886 A | 12/2015 |
| TW | 201545887 A | 12/2015 |
| WO | 92/22604 A1 | 12/1992 |
| WO | 95/17537 A1 | 6/1995 |
| WO | 02/84722 A2 | 10/2002 |
| WO | 03/44079 A1 | 5/2003 |
| WO | 2005048669 A1 | 5/2005 |
| WO | 2006/093639 A1 | 9/2006 |
| WO | 2007/018028 A1 | 2/2007 |
| WO | 2007121524 A1 | 11/2007 |
| WO | 2008/007622 A1 | 1/2008 |
| WO | 2008044884 A1 | 4/2008 |
| WO | 2010/051106 A2 | 5/2010 |
| WO | 2010/059710 A1 | 5/2010 |
| WO | 2010079688 A1 | 7/2010 |
| WO | 2010/098762 A1 | 9/2010 |
| WO | 2010/121524 A1 | 10/2010 |
| WO | 2010/128611 A1 | 11/2010 |
| WO | 2010/129459 A2 | 11/2010 |
| WO | 2011/031507 A1 | 3/2011 |
| WO | 2011/048979 A1 | 4/2011 |
| WO | 2011/104500 A1 | 9/2011 |
| WO | 2011142280 A1 | 11/2011 |
| WO | 2012/000686 A1 | 1/2012 |
| WO | 2012/057893 A2 | 5/2012 |
| WO | 2012/074952 A1 | 6/2012 |
| WO | 2012144499 A1 | 10/2012 |
| WO | 2013/006865 A2 | 1/2013 |
| WO | 2013044941 A1 | 4/2013 |
| WO | 2013058217 A1 | 4/2013 |
| WO | 2013119737 A2 | 8/2013 |
| WO | WO-2013119737 A2 * 8/2013 ........... C03B 33/091 | |
| WO | 2013/179881 A1 | 12/2013 |
| WO | 2014050798 A1 | 4/2014 |
| WO | 2014/093193 A1 | 6/2014 |
| WO | 2014/093740 A1 | 6/2014 |
| WO | 2014/093775 A1 | 6/2014 |
| WO | 2014/093776 A1 | 6/2014 |
| WO | 2014/142280 A1 | 9/2014 |
| WO | 2014/151353 A1 | 9/2014 |
| WO | 2014163035 A1 | 10/2014 |
| WO | 2015/054098 A1 | 4/2015 |
| WO | 2015/057605 A1 | 4/2015 |
| WO | 2015/112958 A1 | 7/2015 |
| WO | 2015113020 A1 | 7/2015 |
| WO | 2015113023 A1 | 7/2015 |
| WO | 2015119210 A1 | 8/2015 |
| WO | 2015156395 A1 | 10/2015 |
| WO | 2015157202 A1 | 10/2015 |
| WO | 2015163134 A1 | 10/2015 |
| WO | 2016017645 A1 | 2/2016 |
| WO | 2016/187186 A1 | 11/2016 |
| WO | 2016209897 A1 | 12/2016 |
| WO | 2018038961 A1 | 3/2018 |

OTHER PUBLICATIONS

ISR from WO2014/093193.
ISR from WO2014/093740.
ISR from WO2014/093775.
ISR from WO2014/093776.
ISR from WO2014/151353 (PCT/US2014/025537).
ISR from WO2015/054098.
ISR from WO2015/057605.
ISR fromPCT/US2015/012865.
Morita et al; "Applications of Plasma Polymerization"; Pure & Appl. Chem., vol. 57, No. 9 pp. 1277-1286 (1985).
Biedermam; "The Properties of Films Prepared by the RF Sputtering of PTFE and Plasma Polymerization of Some Freons"; Vacuum, Vol. 31, No. 7, Jan. 1, 1981, pp. 285-289.
Boscher et al; "Influence of Cyclic Organosilicon Precursors on the Corrosion of Aluminium Coated Sheet by Atmospheric Pressure Dielectric Barrier Discharge"; Surface and Coatings Technology 205; (2011) 5350-5357.
Cech et al; "Surface-Free Energy of Silicon-Based Plasma Polymer Films"; Silanes and Other Coupling Agents, vol. 5, 2009; pp. 333-348.
Chemraz "Perfluoroelastomers—Seals That Withstand the Test of Time" , Greene Tweed Medical & Biotechnology, 2000, 4 Pages.
Chiao et al; "Worldwide First Ultra-Thin LTPS-TFT LCD by a Glass on Carrier Technology"; V3, Submitted to SID 2015; 5 Pages.
Dupont Kalrez Perfluoroelastomer Parts—Physical Properties and Product Comparisons, Technical Information—Rev. 11, Sep. 2012; 4 Pages.
Girifalco et al; "A Theory for the Estimation of Surface and Interfacial Energies. I. Derivation and Application to Interfacial Tension"; Applied Science Research Lab, Cincinnati Ohio; vol. 61 (1956); pp. 904-909.
Groenewoud et al; "Plasma Polymerization of Thiophene Derivatives"; Langmuir, 2003, vol. 19, No. 4; pp. 1368-1374.
Haller; "Polymerization of Aromatic Silanes in RF Plasmas"; J. Electrochem Soc.: Solid-State Science and Technology; vol. 129, No. 1; Jan. 1982; pp. 180-183.
Haque et al; "Preparation and Properties of Plasma-Deposited Films With Surface Energies Varying Over a Wide Range"; Journal of Applied Polymer Science, vol. 32, 4369-4381 (1986.
Hiltz; Techniques for the Characterization of Fluoroelastomers, Defence R&D Canada—Atlantic Technical Memorandum Dec. 2009; 52 Pages.
Iller, John Wiley and Sons; "The Surface Chemistry of Silica" ; Chapter 6, 1979, pp. 622-656.
International Search Report and Written Opinion of the International Searching Authority; PCT/US2013/073785; dated March 24, 2014; 11 Pages; Korean Patent Office.
International Search Report and Written Opinion of the International Searching Authority; PCT/US2013/074859; dated March 25, 2014; 10 Pages; Korean Patent Office.
International Search Report and Written Opinion of the International Searching Authority; PCT/US2013/074924; dated Mar. 27, 2014; 14 Pages; Korean Patent Office.
International Search Report and Written Opinion of the International Searching Authority; PCT/US2013/074926; dated Mar. 21, 2014; 13 Pages; European Patent Office.
International Search Report and Written Opinion of the International Searching Authority; PCT/US2014/059237; dated Mar. 11, 2015; 15 Pages; European Patent Office.
International Search Report and Written Opinion of the International Searching Authority; PCT/US2014/060340; dated Jan. 29, 2015; 13 Pages; European Patent Office.
International Search Report and Written Opinion of the International Searching Authority; PCT/US2016/038663; dated Sep. 23, 2016; 11 Pages; European Patent Office.
International Search Report of the International Searching Authority; PCT/US2016/032843; dated Aug. 10, 2016; 14 Pages; European Patent Office.
Jaszewski et al; "The Deposition of Anti-Adhesive Ultra-Thin Teflon-Like Films and Their Interaction With Polymers During Hot Embossing"; Applied Surface Science, 143 (1999) 301-308.
Kuritka et al; "Mass Spectrometry Characterization of Methylphenylsilane-Hydrogen RF Plasmas"; Plasma Process. Polym. 2007, 4, 53-61.
Lowe et al; "Plasma Polymerized P-Xylene as a Laser Fusion Target"; Surface Science, 1978, vol. 76, No. 1; pp. 242-256.
Lubguban, Jr. et al; "Low-K Organosilicate Films Prepared by Tetravinyltetramethylcyclotetrasiloxane", J. of Applied Physics, V92, N2, p. 1033-1038 , 2002.

(56) References Cited

OTHER PUBLICATIONS

Merche et al; "Atmospheric Plasmas for Thin Film Deposition: A Critical Review"; Thin Solid Films 520, (2012) 4219-4236.
Nagai et al; "Structure and Morphology of Phenylsilanes Polymer Films Synthesized by the Plasma Polymerization Method"; Journal of Material Science 33, (1998); 1897-1905.
Nehlsen et al; "Gas Permeation Properties of Plasma Polymerized Thin Film Siloxane-Type Membranes for Temperature Up to 350C"; Journal of Membrane Science; 106 (1995) 1-7.
Nouicer et al; "Superhydrophobic Surface Produced on Polyimide and Silicon by Plasma Enhanced Chemical Vapour Deposition From Hexamethyldisiloxane Precursor"; International Journal of Nanotechnology, vol. 12, Nos. 8/9, 2015; pp. 597-607.
Parker et al; "Surface Forces Between Plasma Polymer Films"; Langmuir 1994, 10, 276-2773.
Perlast G67P—Technical Data Sheet, Issue 4, Revision 1, Jan. 2006; 1 Page.
Wu; "Polymer Interface and Adhesion"; Modifications of Polymer Surfaces, Chapter 9—Marcel Dekker; pp. 298-321.
Rouessac et al; "Precursor Chemistry for ULK CVD", Microelectronic Engineering, V82, p. 333-340, 2005.
Salyk et al; "Plasma Polymerisation of Methylphenylsilane"; Surface & Coatings Technology, 20, (2005) pp. 486-489.
Shieh et al; "Modifications of Low Dielectric Constant Fluorinated Amorphous Carbon Films by Multiple Plasma Treatments"; J. Electro. Soc.; 149 (7) G384-G390 (2002.
Sindorf et al; "Cross-Polarization/Magic-Angle-Spinning Silicon-29 Nuclear Magnetic Resonance Study of Silica Gel Using Trimethylsilane Bonding as a Probe of Surface Geometry and Reactivity"; J. Phys. Chem. 1982, 86, 5208-85219.
Stoffels et al; "Polymerization of Fluorocarbons in Reactive Ion Etching Plasma"; Journal of Vacuum Science and Technology; Part A, AVS / AIP, Melville, NY, vol. 16, No. 1, Jan. 1, 1998, pp. 87-95.
Suratawal et al; "Surface Chemistry and Trimethylsilyl Functionalization of Stober Silica Sols"; Journal of Non-Crystalline Solids 316 (2003), pp. 349-363.
Terlingen et al; "Plasma Modification of Polymeric Surfaces for Biomedical Applications"; Advanced Biomaterials in Biomedical Engineering and Drug Delivery Systems, 1996; pp. 38-42.
Tillet et al; "Crosslinking of Fluoroelastomers by "Click" Azide-Nitride Cyloaddtion"; Journal of Polymer Science, Part A: Polymer Chemistry; 2015, 53, pp. 1171-1173.
Tong et al; "Reversible Silicon Wafer Bonding for Surface Protection: Water-Enhanced Debonding"; J. Electrochem. Soc., vol. 139, No. 11, Nov. 1992, pp. L101-L102.
Trelleborg Sealing Solutions, Isolast® Perfluororelastomer Seals, Edition Nov. 2008; pp. 1-16; www.tss.trelleborg.com.
Van De Ven et al; "Deactivation With Silazanes in Chromatography, Mechanism of the Reaction and Practical Consequences in Capillary GC and RP-HPLC: A29SI CP-MAS NMR Study"; Journal of High Resolution Chromatography & Chromatography Communications; vol. 9, 1986; pp. 741-746.
Wang et al; "Dynamic Contact Angles and Contact Angle Hysteresis of Plasma Polymers"; Langmuir 1994, 10, pp. 3887-3897.
Wu, "Calculation of Interfacial Tension in Polymer Systems"; J. Polymer. Sci.: Part C, No. 34, pp. 19-30 (1971.

Zhuravlev; "The Surface Chemistry of Amorphous Silica. Zhuravlev Model"; Colloids and Surfaces A: Physicochemical and Engineering Aspects; 173 (2000) 1-38.
2006 Gelest Brochure on Thermal Stability of Silanes, p. 14.
2014 Gelest Brochure—Silane Coupling Agents Connecting Across Boundaries.
3M Dyneon High Temperature Perfluoroelastomer PFE 4131TZ—Technical Data.
ASTM International E595-07, Standard Test Method for Total Mass Loss and Collected Volatile Condensable Materials from Outgassing in a Vacuum Environment (2013).
ISR from PCT/US2015/013012.
English Translation of JP2016547990 Office Action dated Mar. 27, 2019; 3 Pages; Japanese Patent Office.
European Patent Application No. 15740126.6 Office Action dated Jul. 9, 2020; 5 Pages; European Patent Office.
Extended European Search Report and Written Opinion; 15740126.6; dated Jul. 4, 2017; 9 pages; European Patent Office.
Hair; "Hydroxyl Groups on Silica Surface", Journal of Non-Crystalline Solids; 19 (1975) 299-309, .Copyrgt. North-Holland Publishing.
International Preliminary Report on Patentability of the International Searching Authority; PCT/US15/12865; dated Aug. 11, 2016; 7 Pages; Korean Intellectual Property Office.
International Search Report and Writien Opinion of the International Searching Authority; PCT/US2017/049019; dated Dec. 11, 2017; 14 Pages; Korean Intellectual Property Office.
International Search Report and Writien Opinion of the International Searching Authority; PCT/US2018/047056; dated Dec. 7, 2018; 10 Pages; European Patent Office.
International Search Report and Written Opinion of the International Searching Aurthority; PCT/US2017/046836; dated Feb. 7, 2018; 11 Pages; Korean Intellectual Property Office.
Invitation to Pay Additional Fees From the International Searching Aurthority; PCT/US2017/049025; dated Nov. 21, 2017; 14 Pages; European Patent Office.
ISR from WO2014/151353.
Kuschnereit et al; "Mechanical and Elastic Properties of Amorphous Hydrogenated Silicon Films Studied by Broadband Surface Acoustic Wave Spectroscopy"; Appl. Phys. A 61, 269-276 (1995).
Maszara et al; "Bonding of Silicon Wafers for Silicon-On-Insulators"; J. Appl. Phys. 64 (10), Nov. 15, 1988; pp. 4943-4950.
Mazumder et al (WO 2015-112958), Jul. 30, (Year: 2015).
McMillian et al; "Hydroxyl Sites in SiO2 Glass: A Note on Irfrared and Raman Spectra", American Mineralogist, vol. 71 pp. 772-778, 1986.
Oujja et al; "Multiphoton Dissociation of Phenylsilane Upon Excitation at 212.5NM"; Laser Chem., vol. 16, pp. 157-166.
Tauc et al; "Optical Properties and Electronic Structure of Amorphous Germanium"; Phys. Stat. Sol 15, (1966) pp. 627-637.
Weidman et al; "New Photodefinable Glass Etch Masks for Entirely Dry Photolithography Plasma Deposited Organosilicon Hydride Polymers"; Appl. Phys. Leti. 62 (4), Jan. 25, 1993 pp. 372-374.
Worldwide First Ultra-thin LTPS-TFT LCD by a Glass on Carrier Technology, Chiao, et al., v3, submitted to SID 2015.
Sohn, et al., "Effects of plasma polymerized para-xylene intermediate layers on characteristics of flexible organic light emitting diodes fabricated on polyethylene terephthalate substrates" Journal of Alloys and Compounds, 449, 191-195, 2008. (Year: 2008).

\* cited by examiner

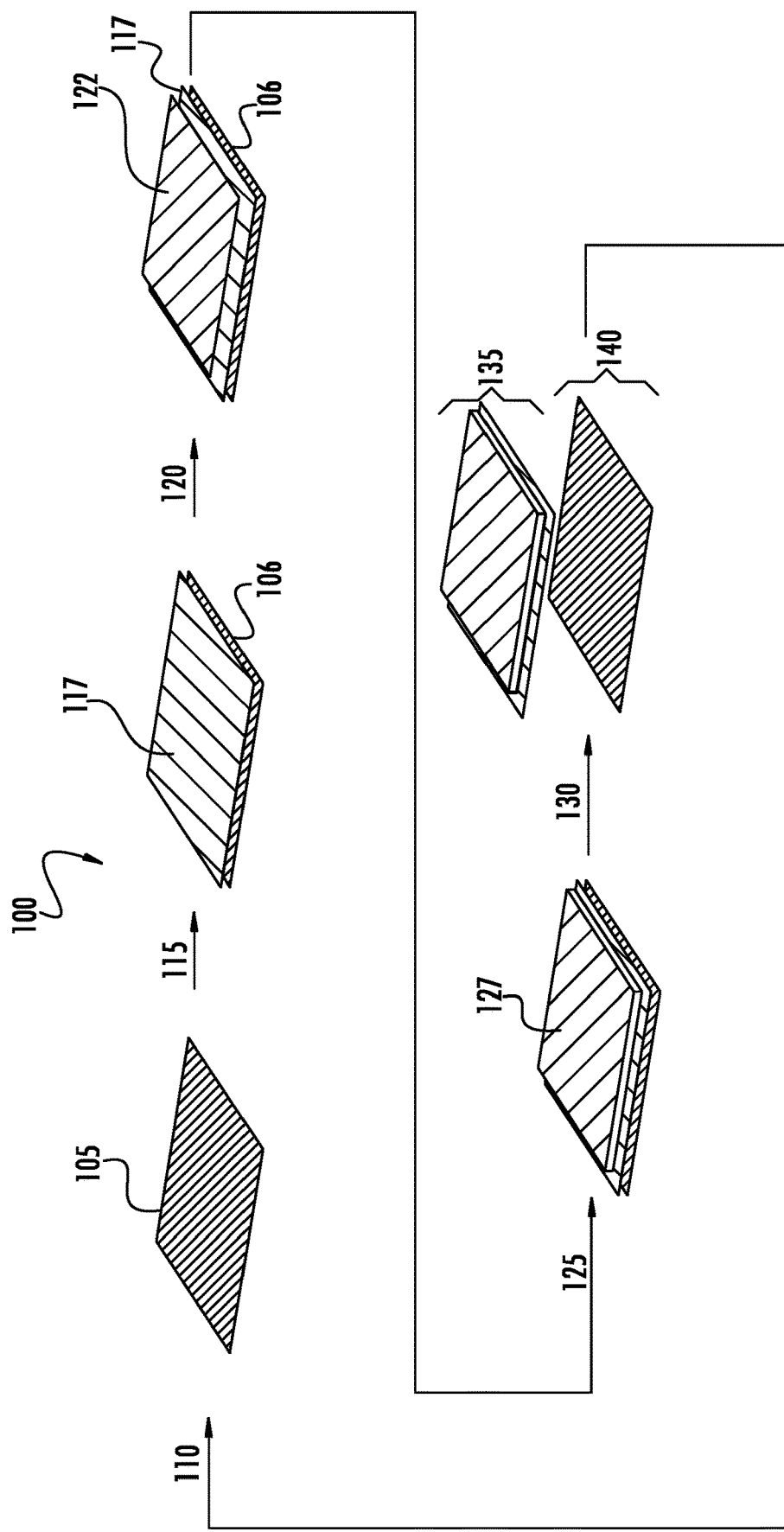

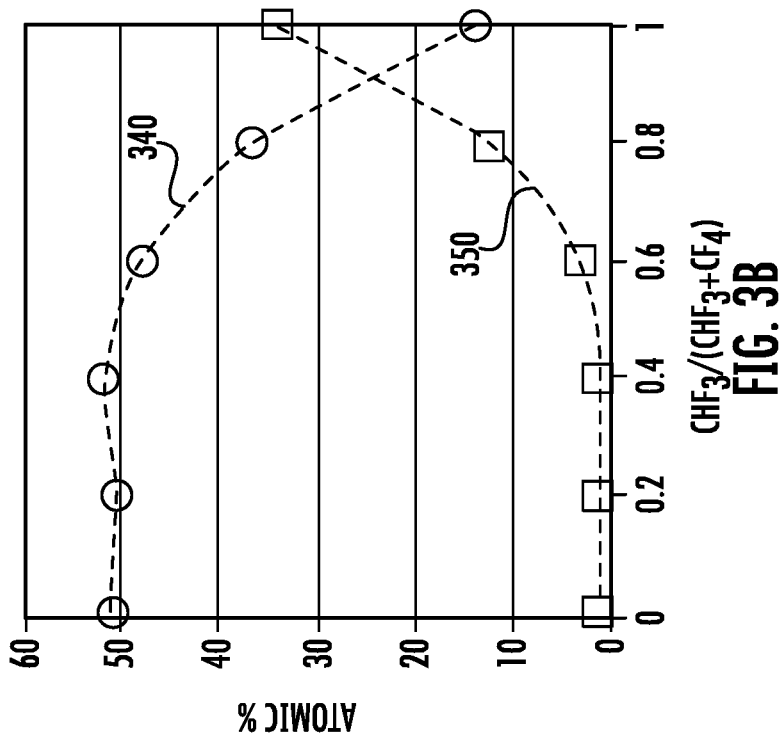
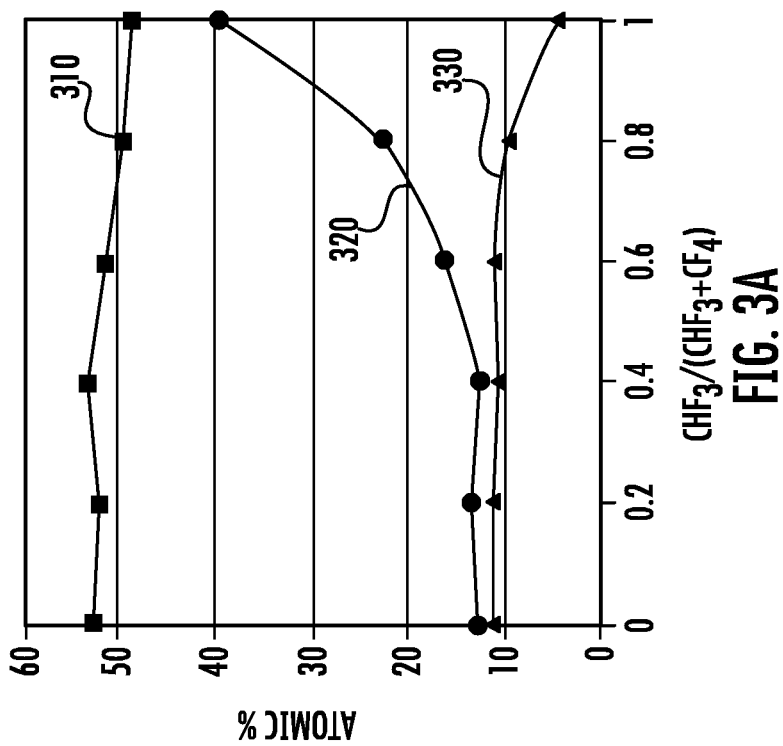

DEVICE MODIFIED SUBSTRATE ARTICLE AND METHODS FOR MAKING

CROSS-REFERENCE TO RELATED APPLICATIONS

This is a continuation application of U.S. application Ser. No. 15/302,098, filed Oct. 5, 2016, which claims the benefit of priority to U.S. Patent Application No. 61/977,364, filed on Apr. 9, 2014, entitled DEVICE MODIFIED SUBSTRATE ARTICLE AND METHODS FOR MAKING, the content of which is incorporated herein by reference in its entirety.

This application is related to, but does not claim priority to, commonly owned and assigned patent Applications: U.S. Ser. No. 61/596,727, filed Feb. 8, 2012, entitled "PROCESSING FLEXIBLE GLASS WITH A CARRIER"; U.S. Ser. No. 14/053,093, filed Oct. 14, 2013, entitled "ARTICLES WITH LOW-ELASTIC MODULUS LAYER AND RETAINED STRENGTH"; U.S. Ser. No. 14/053,139, filed Oct. 14, 2013, entitled "LAMINATE ARTICLES WITH MODERATE ADHESION AND RETAINED STRENGTH"; U.S. Ser. No. 61/736,880, filed Dec. 13, 2012, entitled "FACILITATED PROCESSING FOR CONTROLLING BONDING BETWEEN SHEET AND CARRIER"; and U.S. Ser. No. 61/736,887, filed Dec. 12, 2012, entitled "GLASS AND METHODS OF MAKING GLASS ARTICLES."

This application is related to, but does not claim priority to, U.S. Ser. No. 14/248,868, filed on Apr. 9, 2014 entitled "GLASS ARTICLES HAVING FILMS WITH MODERATE ADHESION AND RETAINED STRENGTH."

The entire disclosure of any publication or patent document mentioned herein is entirely incorporated by reference.

BACKGROUND

The disclosure relates to a laminate article, the manufacture and use of the laminate article, and a glass sheet article or non-glass sheet article having a device modified surface for use in or as, for example, an electrical or an electronic device. Additionally, the disclosure relates to a method for bonding and debonding a glass sheet article or non-glass sheet article and a carrier substrate.

SUMMARY

In embodiments, the disclosure provides a glass device substrate or non-glass device substrate having a device modified surface.

In embodiments, the disclosure provides a laminate article comprising a glass device substrate work piece reversibly bonded to a reusable carrier, the laminate having a silicon and oxygen depleted and fluorine and carbon enriched glass surface at the interface.

In embodiments, the disclosure provides a method for bonding and debonding a laminate comprising a glass device substrate work piece and a carrier substrate for the work piece.

In embodiments, the disclosure provides a method for forming a moderate or intermediate strength bond or adhesion between a carrier and a thin glass device substrate to create a temporary bond, which temporary bond is sufficiently strong to survive, for example, thin film transistors (TFT) processing, but the bond is sufficiently weak to permit timely debonding or separation of the carrier substrate and the glass device substrate after surface processing of the device substrate is completed. The intermediate strength bond or moderate bonding property enables a re-usable carrier function and manufacturing cycle. The moderate bonding property can be, for example, in one or more portions of the area between the carrier substrate and the device substrate work piece, or the entire area between the carrier substrate and the device substrate work piece.

BRIEF DESCRIPTION OF THE DRAWINGS

In embodiments of the disclosure:

FIG. 1 shows a schematic of the disclosed reusable carrier process (100).

FIGS. 3A and 3B show surface concentrations of fluorine (310) and carbon (320) and oxygen (330), (FIG. 3A) as measured by XPS and the concentration of inorganic fluorine atoms (bonded to metal) (340) and the concentration of organic fluorine atoms (in fluoropolymer) (350) (FIG. 3B) as measured by XPS for fluorocarbon plasma treated glass surfaces treated with different mol fractions of $CF_4$ and $CHF_3$.

DETAILED DESCRIPTION

Figure 2B:
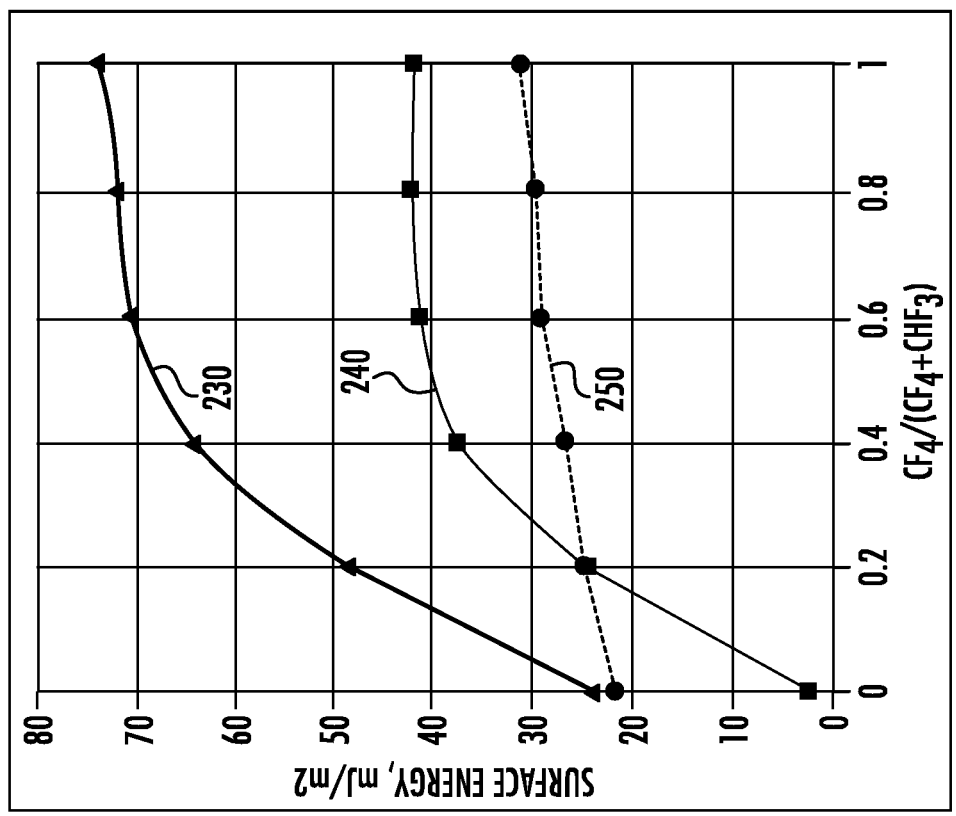
FIGS. 2A and 2B show the change in contact angle (FIG. 2A) and surface energy (FIG. 2B) for $CF_4$ and $CHF_3$ plasma polymer treated glass surfaces.

Various embodiments of the disclosure will be described in detail with reference to drawings, if any. Reference to various embodiments does not limit the scope of the invention, which is limited only by the scope of the claims attached hereto. Additionally, any examples set forth in this specification are not limiting and merely set forth some of the many possible embodiments of the claimed invention.

Definitions

"At %," "at %," or like refer to atom or atomic percentage.

"Temporary bond" refers to a non-destructive and reversible adhesion between a glass device substrate and the carrier substrate of the disclosed laminate, which bond is sufficient to survive further surface modification processing, but which bond can be disrupted with, for example, a mechanical force to permit separation of the processed thin glass device substrate and the carrier substrate.

"Thin glass device substrate" refers to, for example, Corning® Willow® glass, and having thicknesses as defined herein.

"Include," "includes," or like terms means encompassing but not limited to, that is, inclusive and not exclusive.

"About" modifying, for example, the quantity of an ingredient in a composition, concentrations, volumes, process temperature, process time, yields, flow rates, pressures, viscosities, and like values, and ranges thereof, or a dimension of a component, and like values, and ranges thereof, employed in describing the embodiments of the disclosure, refers to variation in the numerical quantity that can occur, for example: through typical measuring and handling procedures used for preparing materials, compositions, composites, concentrates, component parts, articles of manufacture, or use formulations; through inadvertent error in these procedures; through differences in the manufacture, source, or purity of starting materials or ingredients used to carry out the methods; and like considerations. The term "about" also encompasses amounts that differ due to aging of a composition or formulation with a particular initial concentration or mixture, and amounts that differ due to mixing or processing a composition or formulation with a particular initial concentration or mixture.

"Optional" or "optionally" means that the subsequently described event or circumstance can or cannot occur, and that the description includes instances where the event or circumstance occurs and instances where it does not.

The indefinite article "a" or "an" and its corresponding definite article "the" as used herein means at least one, or one or more, unless specified otherwise.

Abbreviations, which are well known to one of ordinary skill in the art, may be used (e.g., "h" or "hrs" for hour or hours, "g" or "gm" for gram(s), "mL" for milliliters, and "rt" for room temperature, "nm" for nanometers, and like abbreviations).

Specific and preferred values disclosed for components, ingredients, additives, dimensions, conditions, times, and like aspects, and ranges thereof, are for illustration only; they do not exclude other defined values or other values within defined ranges. The apparatus and methods of the disclosure can include any value or any combination of the values, specific values, more specific values, and preferred values described herein, including explicit or implicit intermediate values and ranges.

In embodiments, the disclosure provides a method of forming a temporary bond by surface modification, which surface modification creates moderate or intermediate adhesion between at least a portion of the surface of a work piece substrate and at least a portion of the surface of the glass carrier substrate to produce a laminate for use in making a device modified substrate from the work piece substrate.

The temporary bonding condition in the laminate eliminates waste and can reduce manufacturing costs by permitting manufacturers to re-use the carrier member for device fabrication on the thin glass sheet as schematically shown in FIG. 1.

In embodiments, the disclosure provides a method of making a laminate article that includes: forming a temporary bond between at least a portion of a work piece, such as a glass sheet, a glass substrate, or a non-glass substrate (e.g., a flexible glass sheet or silicon wafer), and a glass carrier substrate.

Forming the temporary bond can be accomplished by, for example, treating to effect a surface modification, which surface modification creates moderate adhesion between the work piece and the carrier substrate.

The intermediate or moderate adhesion can be achieved by depletion of the surface layer of silicon and oxygen atoms and the enrichment of the surface layer of fluorine and carbon atoms. The depletion of silicon atoms also leads to a relative enrichment of other cations in glass work piece or carrier substrate, which other cations are not depleted with the silicon atoms. For example, depletion of silicon atoms such as in silica in the treated surface layer leads to a relative enrichment in alumina and alkaline earth atoms. In embodiments, the modified surface can be formed by, for example, an etch process. However, the deposition or etch processes can deplete a glass work piece's surface of silica, boron, and other glass components, and consequently can enrich the glass work piece's surface in alkaline earths and fluorine reaction products in a relative sense.

The surface energy of the modified surface is adjustable between, for example, Teflon® and glass depending on the relative ratio of etch gas to polymer former. In a preferred embodiment, exposure to a plasma containing a high ratio of etch gas to polymer former can create a highly polar surface having a sparse coverage of carbon based polymers on a modified glass surface where most metal to oxygen bonds have been replaced by metal to fluorine bonds. This highly polar surface exhibits a high energy surface which readily bonds with glass provided that the surface roughness is small, for example, below about 2 nm. The temporary bonding preferably is strong enough to survive flat panel display (FPD) processing, including, for example, wet ultrasonic, vacuum, and thermal processes, and remain de-bondable by application of a sufficient peeling force. De-bonding permits disintegration of the laminate, that is separation of the glass carrier substrate from the processed thin glass sheet having, for example, devices or structure on the surface of the thin glass sheet resulting from intermediate processing. The separated glass carrier, if desired, can be repeatedly re-used in numerous cycles of the disclosed method.

In embodiments, the disclosed method uses moderate bonding of a flexible glass sheet (i.e., a work piece) to the glass carrier, which moderate bonding permits the subsequent removal of the thin glass sheet from the carriers to provide re-usable carrier.

The disclosed method is advantaged in several respects, including, for example:

eliminating an air gap between the flexible glass sheet and the glass carrier substrate, which air gap is disclosed in prior methods, to provide greater manufacturing reliability in vacuum, ultrasonic, and wet processing;

providing a flexible, thin, or like glass sheet, or non-glass sheet, work piece having a flatter facial work surface that can improve an user's latitude in circuit or device construction on the work piece and processing (e.g., lithography) by reducing the height variation within the laminate;

providing simpler bonding surface preparation and bonding surface processing;

providing easier de-bonding or separation of the work piece from the carrier substrate;

providing a reusable carrier substrates; and providing a bonding surface between the work piece and the carrier substrate that offers higher thermal stability than commercially available polymer wafer bonding approaches.

In embodiments, the disclosed flexible substrates offer an opportunities for less costly manufacturing of devices using, for example, roll-to-roll processing, and the potential to make thinner, lighter, more flexible and durable displays. However, the technology, equipment, and processes required for roll-to-roll processing of high quality displays are not yet fully developed. Since panel makers have already heavily invested in toolsets to process large sheets of glass, laminating a flexible substrate to a carrier substrate and making display devices by a sheet-to-sheet process offers a shorter term solution to develop the value proposition of thinner, lighter, and more flexible displays. Displays have been demonstrated on polymer sheets such as polyethylene naphthalate (PEN) where the device fabrication was sheet-to-sheet with the PEN laminated to a glass carrier. The upper temperature limit of the PEN limits the device quality and processes that can be used. In addition, the high permeability of the polymer substrate leads to environmental degradation of OLED devices where a near hermetic package is typically required. Thin film encapsulation offers promise potential solution to overcome this limitation, but the encapsulation approach has not yet been demonstrated to provide acceptable yields for large volumes.

In a similar manner, display devices can be manufactured using a glass carrier substrate that has been laminated to one or more flexible glass substrates. It is anticipated that the low permeability and improved temperature and chemical resistance of the flexible glass substrate will enable higher performance, longer lifetime, and flexible displays.

The above mentioned commonly owned and assigned U.S. Ser. No. 61/596,727 mentions bonding a thin sheet, for example, a flexible glass sheet, to a carrier initially by van der Waals forces, then increasing the bond strength in certain regions while retaining the ability to remove the thin sheet after processing the thin sheet or carrier to form devices thereon, for example, electronic or display devices, components of electronic or display devices, OLED materials, photo-voltaic (PV) structures, or thin film transistors. At least a portion of the thin glass is bonded to a carrier substrate such that there is prevented device process fluids from entering between the thin sheet and carrier, where there is provided a reduced possibility of contaminating downstream processes, i.e., the bonded seal between the thin sheet and carrier is hermetic, and in some preferred embodiments, this seal encompasses the outside of the article thereby preventing liquid or gas intrusion into or out of any region of the sealed article.

JP2013184346 and WO2013179881, assigned to Asahi, mention a peelable glass laminated body having a support substrate with a first inorganic layer, and a glass substrate with an inorganic layer provided with a second inorganic layer, either or both of the first and second inorganic layers contain at least one of: a metal oxide, metal nitride, a metal oxynitride, metal carbide, a metal carbonitride, a metal silicide, or a metal fluoride.

In low temperature polysilicone (LTPS) device fabrication processes, temperatures approaching 600° C. or greater, vacuum, and wet etch environments may be used. These conditions limit the materials that may be used, and place significant stability demands on the laminate's components comprised of a carrier substrate and a sheet substrate.

In embodiments, the disclosure provides a method for bonding a flexible glass sheet to a carrier substrate to form a laminate, processing the laminate, such as creating a circuit or device on the outer unbonded surface of the flexible glass sheet, and debonding the flexible glass sheet from a carrier. The method can use existing capital infrastructure, enables processing of thin flexible glass, for example, glass having a thickness less than or equal to 0.3 mm thick, without contamination or loss of bond strength between the thin flexible glass and carrier substrate at higher processing temperatures, and the resulting surface or device modified thin flexible glass de-bonds easily from the carrier substrate at the end of the process.

In embodiments, the disclosure provides a method having considerable operational flexibility, including for example: cleaning and surface preparation of the flexible glass sheet and carrier substrate to facilitate bonding; maintaining adequate bond strength between the flexible sheet and the carrier substrate at the bonded area; maintaining releasability of the flexible sheet from the carrier substrate; and optionally cleaning the separated carrier substrate for reuse in the method.

In embodiments, in the glass-to-glass bonding process, the work-piece and carrier substrate glass surfaces can be cleaned prior to laminate joining to remove all extraneous metal, organic, and particulate residues, and to leave a mostly silanol terminated contact surface.

If the glass contact surfaces are first brought into intimate contact, where van der Waals forces pull them together, with heat and optionally pressure, the surface silanol groups can condense to form strong Si—O—Si bonds across the interface between the opposing glass surfaces to permanently fuse the opposing glass pieces causing the opposing pieces inseparable without breakage. Metal, organic, and particulate residue can be used to prevent or limit bonding of the opposing glass pieces by obscuring at least one glass surface and preventing intimate contact, which obscuration may be called for to further moderate bonding between the work-piece substrate and carrier substrate glass.

A high silanol surface concentration can form an undesirably strong bond between the opposing glass pieces. The number of bonds per unit area will be determined by the probability of two silanol species on opposing surfaces reacting to condense out water. Zhuravlev has reported the average number of hydroxyls per $nm^2$ for well hydrated silica as from 4.6 to 4.9. (see Zhuravlev, L. T., *The Surface Chemistry of Amorphous Silika, Zhuravlev Model*, Colloids and Surfaces A: Physiochemical Engineering Aspects, 173 (2000) 1-38).

In the abovementioned U.S. Ser. No. 61/596,727, a non-bonding region is formed within a bonded periphery, and the primary means described for forming such non-bonding area is increasing surface roughness. A roughness of greater than 2 nm Ra is called for to prevent opposing glass-to-glass bonds from forming during the elevated temperature phase of the bonding process. In U.S. Ser. No. 61/736,880 a non-bonding area is formed by weakening the van der Waals bonding between carrier and thin glass.

Thermal, vacuum, solvent, acidic, and ultrasonic flat panel display (FPD) processes require a robust bond between the thin flexible glass bound to a carrier.

Three transistor technologies are used in mass production for FPD backplane fabrication, including: amorphous silicon (aSi) bottom gate TFT; polycrystalline silicon (pSi) top gate TFT; and amorphous oxide (IGZO) bottom gate TFT. The general process begins with cleaning of a glass substrate, typically in hot alkaline solutions with ultrasonic or megasonic agitation, followed by DI water rinse.

The device structure can be fabricated in a number of subtractive cycles of material deposition and photolithographic patterning followed by material etching. Metal, dielectric, and semiconductor materials can be deposited by vacuum processes (e.g., sputtering metals, transparent conductive oxides and oxide semiconductors, Chemical Vapor Deposition (CVD) deposition of amorphous silicon, silicon nitride, and silicon dioxide at elevated temperature, 150 to 450° C.). Other thermal process steps can include, for example, up to 600° C. p-Si crystallization, 350 to 450° C. oxide semiconductor annealing, up to 650° C. dopant annealing, and about 200 to 350° C. contact annealing. Layers can be patterned by a photolithographic patterning of a polymer resist, etching, and followed by resist strip. Both vacuum plasma (dry) etch and acidic wet etch processes can be used. In FPD processing, the photoresist is typically stripped by a hot solvent and, for example, along with ultrasonic or megasonic agitation.

Adhesive wafer bonding has been widely used in microelectromechanical systems (MEMS) and semiconductor processing for back end steps where processes are less harsh.

Commercial adhesives by Brewer Science and Henkel are typically thick polymer adhesive layers of about 5 to 200 microns. The large thickness of these layers can create the potential for large amounts of volatiles, trapped solvents, and adsorbed species to contaminate FPD processes. These materials can thermally decompose and outgas above about 250° C. The materials can also cause contamination in downstream steps by acting as a sink for gases, solvents, and acids, which can outgas in subsequent processes or process steps.

An overly strong covalent bond between the thin glass work piece and the glass carrier can preclude complete separation and re-usability of the carrier.

In the abovementioned U.S. Ser. No. 61/596,727 applicant demonstrated FPD by the formation of a strong covalent bond around the periphery of a thin glass sheet bound to a carrier, and that the thin glass sheet bound to the carrier was durable enough to survive FPD processing. However, the carriers were not reusable. The periphery was permanently bonded by covalent Si—O—Si bonding with an adhesive force of about 2000 mJ/m$^2$, which is on the order of the fracture strength of the glass, which is approximately 2500 mJ/m$^2$. Prying or peeling cannot be used to separate flexible glass piece and carrier. Instead, the non-bonded center with the surface constructed devices is scribed and extracted leaving as scrap a bonded periphery on the carrier.

Although not being bound by theory, surface adhesion theory has been extensively studied and articulated (see "A theory for the estimation of surface and interfacial energies. I. derivation and application to interfacial tension", L. A. Girifalco and R. J. Good, J. Phys. Chem., 61, 904 (1957)).

In U.S. Ser. No. 61/736,887 it was demonstrated that thin plasma fluoropolymer surface treatments can vary the surface energy of glass between that of Teflon® and water.

This precise control of both Van der Waal and covalent interactions at their fractional values via surface modification to achieve desired adhesion energy is an aspect of the present disclosure.

In embodiments, the disclosure provides a method of making a device modified substrate supported on a glass carrier substrate, comprising:

treating at least a portion of the first surface of a glass device substrate, at least a portion of a first surface of a glass carrier substrate, or a combination thereof, wherein the treated glass surface has:
silicon of about 0.1 to about 14 at %;
oxygen of about 1 to about 40 at %;
carbon of about 3 to 60 at %;
fluorine of about 5 to 65 at %; and
a metal to fluorine (M:F) atomic ratio of about 1:1 to about 1:3;
contacting the treated glass surface with an untreated or a like-treated counterpart glass device substrate or glass carrier substrate to form a laminate comprised of the glass device substrate bonded to the glass carrier substrate;
modifying at least a portion of the non-bonded second surface of the glass device substrate of the laminate with at least one device surface modification treatment; and
optionally separating the glass device substrate having the device modified second surface from the glass carrier substrate.

In embodiments, when the device modified substrate is a glass, for example, Corning® Eagle XG® ("EXG"), the treated surface or interface can preferably have:
silicon of about 2 to about 9 at %;
oxygen of about 7 to about 14 at %;
carbon of about 4 to 10 at %; and
fluorine of about 45 to 60 at %, as measured by XPS.

The measured atomic % can vary depending upon the surface measurement method selected, for example, XPS or ESCA can probe the outer most 10 nm of the surface, such as 2 to 6 nm.

In embodiments, the method can further comprise heating the laminate in at least one device surface modification treatment at from about 200 to about 700° C., for 1 second to 1200 minutes.

In embodiments, treating can include or comprise, for example: contacting at least one portion of the glass surface with a fluorocarbon plasma comprised of polymerizing agents or etching agents, or a combination thereof.

In embodiments, the polymerizing agents can include or comprise, for example, at least one of $CHF_3$, $C_4F_8$, $C_3F_6$, $C_3F_8$, $H_2$, $CH_4$, a hydrocarbon having from 3 to 12 carbon atoms and free of fluorine atoms selected from the group consisting of an alkane, an alkenes, an alkyl, an aromatic, or a combination thereof, and the etching agents comprise at least one of $CF_4$, $C_2F_6$, $NF_3$, $SF_6$, HF, or a combination thereof.

In embodiments, the laminate can have an interfacial bond with an adhesive strength of from about 100 to about 2,000 mJ/m$^2$ between the glass device substrate and the glass carrier substrate.

In embodiments, treating can be accomplished, for example, on both of the glass device substrate and the glass carrier substrate, or alternatively, accomplished on only one of the glass device substrate or the glass carrier substrate.

In embodiments, the glass device substrate can have a thickness of, for example, from about 10 to about 500 microns, the carrier glass substrate has a thickness of, for example, about 200 microns to 3 mm, and the thickness of the interfacial bonding layer between the glass device substrate and the glass carrier substrate of, for example, from about a single atomic layer to about 100 nanometer.

In embodiments, modifying with at least one device surface modification treatment is selected from, for example, at least one of: etching, coating, printing, plating, vapor deposition, sputtering, and like modifying treatments, or combinations thereof.

In embodiments, separating can be, for example, at least one of:
peeling the device surface modified glass device substrate from the glass carrier substrate, peeling the glass carrier substrate from the glass device substrate, or both; and
contacting at least one of the glass device substrate or the glass carrier substrate with a suction device, a gripper device, a knife edge, or a combination thereof.

In embodiments, the method can further comprise, for example, cleaning the separated glass carrier substrate for repeated reuse in the method.

In embodiments, the glass carrier substrate, the glass device substrate, or both, can be, for example, flexible, rigid, or have an intermediate flexibility or rigidity.

In embodiments, the disclosure provides a laminate glass article, comprising:
a glass device substrate bonded to a glass carrier substrate with at least one bonded surface that has been treated with a plasma selected from:
a fluoropolymer;
the reaction products of a fluorinated etching agent;
or a combination thereof, wherein the interfacial bond strength between the glass device substrate and the carrier glass substrate is from about 100 to about 1,000 mJ/m$^2$, the interface between the glass device substrate and the glass carrier has a silicon content of from about 1 to about 14 at %; a fluorine content of from about 5 to 60 at %, and the interface between the glass device substrate and the glass carrier substrate has a metal to fluorine (M:F) atomic ratio of about 1:1 to 1:3.

In embodiments, the glass device substrate or device modified substrate has a facial contact area that is smaller than, larger than, or the same size, compared to the facial contact area of the glass carrier substrate.

In embodiments, the article can further comprise, for example, the non-bonded second surface of the glass device substrate in the laminate article having at least one device modified surface area.

In embodiments, the glass device substrate can have a thickness of from about 20 to about 500 microns, the carrier glass substrate has a thickness of about 200 microns to about 3 mm, and the thickness of the interfacial bonding layer between the glass device substrate and the glass carrier substrate can be, for example, from about a single atomic layer to about 100 nanometer.

In embodiments, the disclosure provides a method of making a laminate article comprising a device substrate having a device modified semiconductor substrate supported on a glass carrier substrate, the method comprising:
treating at least a portion of a first surface of the glass carrier substrate, wherein the treated first surface has:
silicon of about 0.1 to about 14 at %;
oxygen of about 1 to about 40 at %;
carbon of about 3 to 60 at %;
fluorine of about 5 to 65 at %; and
a metal to fluorine (M:F) atomic ratio of about 1:1 to about 1:3; and
contacting the treated first surface with the device semiconductor substrate to form a laminate comprised of the device semiconductor substrate bonded to the treated first surface of the glass carrier substrate;
modifying at least a portion of the non-bonded second surface of the device semiconductor substrate of the laminate with at least one device surface modification treatment; and
optionally separating the device semiconductor substrate having the device modified second surface from the glass carrier substrate.

In embodiments, the glass device substrate can have a thickness of from about 20 to about 500 microns, the carrier glass substrate has a thickness of about 200 microns to about 3 mm, and the thickness of the interfacial bonding layer between the glass device substrate and the glass carrier substrate can be, for example, from about a single atomic layer to about 100 nanometer.

In embodiments, the method can further comprise, for example, heating the laminate in at least one device surface modification treatment at from about 200 to about 700° C., for 1 second to 1200 minutes.

In embodiments, treating can comprise: contacting the glass surface with a fluorocarbon plasma comprised of a polymerizing agent, an etching agent, or a combination thereof; and
the device substrate is selected from a silicon (Si), a gallium arsenide (GaAs), or a combination substrate.

In embodiments, the polymerizing agent can be, for example, at least one of CHF$_3$, C$_3$F$_8$, C$_3$F$_6$, H$_2$, CH$_4$, a hydrocarbon having from 3 to 12 carbon atoms and free of fluorine atoms selected from the group consisting of hydrocarbyl moieties, such as an alkane, an alkene, an alkyl, an aromatic, or a combination thereof; and the etching agent comprise at least one of CF$_4$, C$_2$F$_6$, NF$_3$, SF$_6$, HF, or a combination thereof.

In embodiments, the laminate can have an interfacial bond with an adhesive strength of from about 100 to about 1,000 mJ/m$^2$ between the device semiconductor substrate and the glass carrier substrate.

In embodiments, the device semiconductor substrate has a thickness of from about 20 to about 1000 microns, the carrier glass substrate has a thickness of about 200 microns to 3 mm, and the thickness of the interfacial bonding layer between the device semiconductor substrate and the glass carrier substrate is from about a single atomic layer to about 100 nanometer.

In embodiments, modifying with at least one device surface modification treatment can be, for example, at least one of: etching, coating, printing, plating, vapor deposition, sputtering, or combinations thereof.

In embodiments, the method of making a device semiconductor substrate can further include, for example, cleaning the separated glass carrier substrate for repeated reuse in the method.

In embodiments, the glass carrier substrate can be, for example, flexible, rigid, or can have an intermediate flexibility or rigidity.

In embodiments, the device substrate can be, for example, flexible, rigid, or has an intermediate flexibility or rigidity.

In embodiments, the laminate glass article, can include, for example:
a device semiconductor substrate bonded to a glass carrier substrate, the bond comprising the glass carrier having a surface modified by plasma treatment for from at least one of the following: a fluoropolymer; the reaction products of the fluorinated etching agents, with the glass substrate; or a combination thereof,
wherein the interfacial bond strength between the device semiconductor substrate and the carrier glass substrate is from about 100 to about 1,000 mJ/m$^2$, the interface between the device semiconductor substrate and the glass carrier has silicon content of from about 0.1 to about 14 at %; a fluorine content of from about 5 to 60 at %, and the interface between the flexible glass sheet article and the glass carrier has a metal to fluorine (M:F) atomic ratio of about 1:1 to 1:3.

In embodiments, the device semiconductor substrate has a facial contact area that is smaller than, larger than, or the same size, compared to the facial contact area of the glass carrier substrate.

In embodiments, the article can further comprise the non-bonded second surface of the device semiconductor substrate in the laminate having at least one device modified surface.

In embodiments, the device semiconductor substrate has a thickness of from about 20 to about 1000 microns, the carrier glass substrate has a thickness of about 200 microns to about 3 mm, and the thickness of the interfacial bonding layer between the device semiconductor substrate and the glass carrier substrate can be, for example, from about a single atomic layer to about 100 nanometer.

Referring to the Figures, FIG. 1 shows a schematic of the disclosed reusable carrier process (100). The reusable process (100) can include, for example, a carrier cleaning or pre-conditioning step (110) where a carrier substrate (105) substrate, such as a new (105) or re-used (140) substrate, is subjected to cleaning (110) to produce the cleaned or pre-conditioned carrier (105 or 140). The carrier (105) can be, for example, a sheet or roll stock made of glass, ceramic, and like materials, or a combination of materials. The resulting carrier (105 or 140) can be subjected to the disclosed adhesive surface conditioning or an adhesive surface treatment (115) to, for example, deposit an adhesive layer with extended treatments, or more preferably with shorter treatments, create a chemically altered interface (117) on the treated carrier (106). The adhesive treatment can be, for example, an additive plasma fluoropolymer treatment, a subtractive etchant treatment, or a combination thereof, as described herein. Next, the carrier (106) having the adhesive conditioned surface treatment (117) receives a work piece (122), such as a flexible glass sheet, in a bonding or combination (120) step to provide a laminate. The adhesive conditioning or surface treatment can include heating the conditioned surface (117), the carrier (106), or both, with or without the work piece (122) present. The laminate comprised of the bonded or combined work piece (122) and the carrier (106), can be subjected to, for example, one or more device surface modification step or steps (125), which modifies the exterior work surface of the flexible glass sheet work piece (122), that is, on the surface of the work piece which is not facing or is not in direct contact with the carrier (106) or not in direct contact with the interfacial adhesive layer (117), to provide the laminate having an exterior surface modification comprising the combined work piece (122) and carrier (106) having a device modified work surface (127) on the work piece (122). Device or work surface modification can include any of one or more compatible steps, for example, additive processing, subtractive processing, or combinations thereof, that substantively changes at least a portion of the work surface, for example, coating, deposition, controlled topological changes, scoring, cutting, drilling, machining, circuit creation, device creation, flat panel display (FPD) fabrication, and like surface modifications, or combinations thereof. The laminate comprising the combined work piece (122) and the carrier (106) having the modified work surface (127) can be separated or de-bonded (130) by any suitable means, method, or instrumentality, for example, by a mechanical force or contact, such as with a knife edge or blade, suction cup or gripper, air knife, and like tools or techniques, to separate the work piece (135) such as a device surface modified glass sheet, from the carrier (106). The used carrier (140) can be cleaned to produce a re-used carrier (105) described above, and the above described process can be repeated continuously.

Figure 2A:
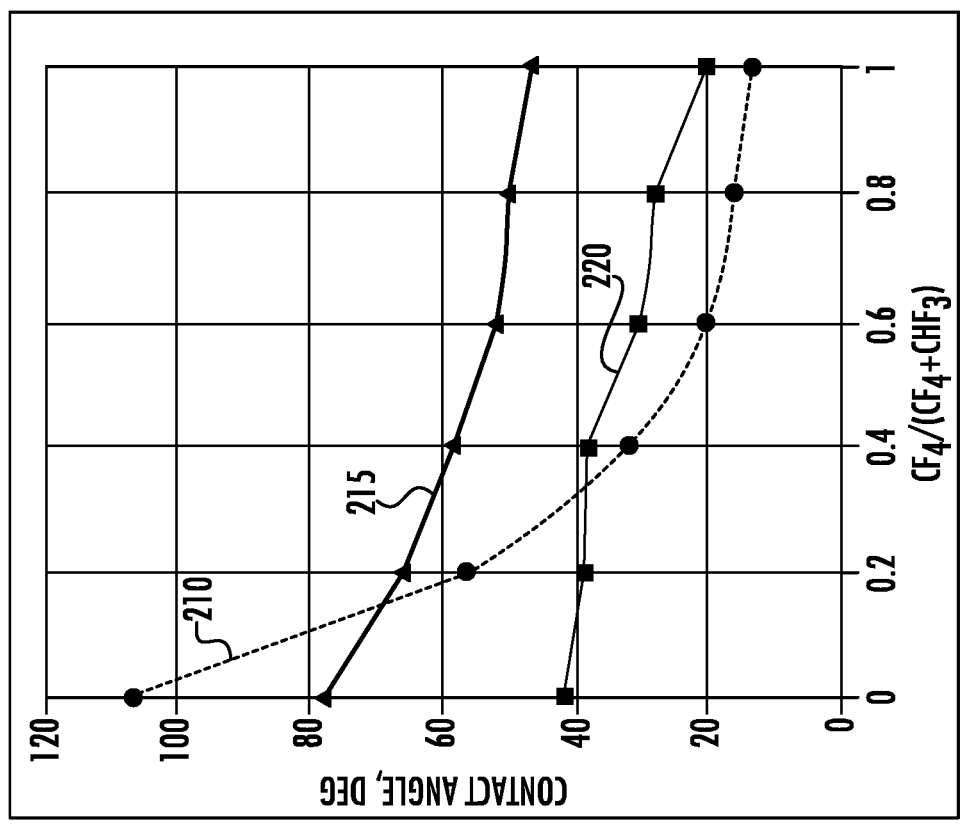

FIGS. 2A and 2B show the change in contact angle (FIG. 2A) and surface energy (FIG. 2B) for CF4 and CHF3 plasma polymer treated glass surfaces. The contact angle measurements in FIG. 2A used different solvents (210, water; 215, diiodomethane; and 220, hexadecane). The surface energy measurements in FIG. 2B used different energy metrics (230, total; 240, polar; and 250, dispersion; where total energy (230) is the sum of the polar and the dispersion energies, i.e., "240+250"). The surface energy and the polar and dispersion components are measured by fitting the Wu model (see S. Wu, *J. Polym. Sci C* 34, 19 (1971)) of solid-liquid interfacial energy to three contact angles of three test liquids: water, diiodomethane, and hexadecane.

FIGS. 3A and 3B show surface concentrations of fluorine (310), carbon (320), and oxygen (330) (FIG. 3A), and concentration of fluorine atoms due to metal fluorides (340) and concentration of fluorine atoms attributable to fluoropolymer (350) (FIG. 3B) as measured by XPS for $CF_4$ and $CHF_3$ plasma fluoropolymer treated Eagle XG® glass surfaces having different mol fractions of $CF_4$ and $CHF_3$ in the plasma. The surface concentration of fluorine varies little (e.g., 49 to 52 at %) across the $CF_4$ and $CHF_3$ gas mixture, while the carbon concentration decreases as $CF_4$ is added. The high fluorine concentration (49 to 52 at %) and low oxygen (7.5 to 12 at %) is consistent with the $CHF_3$ and $CF_4$ plasma polymer surface treatment forming a metal fluoride surface.

Figure 4:
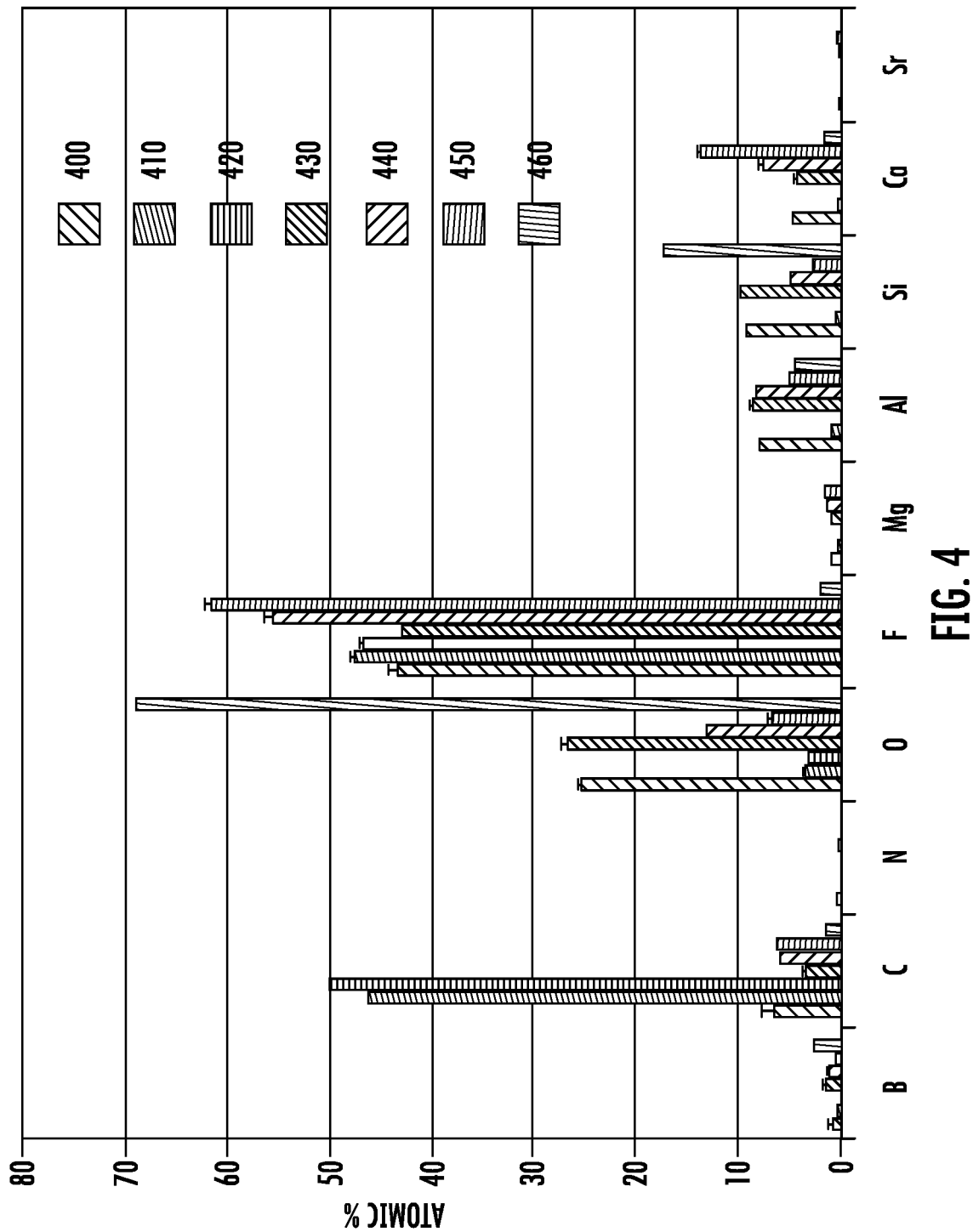
FIG. 4 shows changes in the glass surface elemental composition in atomic % as measured by XPS with increasing polymer forming plasma treatment times for separate $CHF_3$ or $CF_4$ plasma treatments.

FIG. 4 shows the changes in elemental surface composition as measured by XPS as a function of different plasma treatment times. In each instance, the flow rate of the gas was 50 standard cubic centimeter per minute (sccm) at a pressure of 50 milli-torrs. The plasma treatment was either pure $CHF_3$ or pure $CF_4$ (400, 410, and 420 refer to 6 seconds, 60 seconds, and 600 seconds of $CHF_3$ plasma treatments, respectively, and 430, 440, and 450 refer to 6 seconds, 60 seconds, and 600 seconds of $CF_4$ plasma treatment times, respectively). The surface composition of untreated flat glass is also presented for comparison (460; negative control). The data shows that while for 6 seconds of plasma treatment, the surface concentration of carbon is less than 10 at %, the surface concentration of fluorine exceeds 40 at %.

FIG. 4 also shows that for $CF_4$ plasma polymer surface treatments there is little increase in carbon or fluorine concentration after 6 seconds. Silicon, oxygen, and boron concentrations decrease with increasing $CF_4$ plasma exposure time, while Al, Mg, Ca, and Sr concentrations increase with increasing $CF_4$ plasma exposure time. This is consistent with $CF_4$ plasma treatment etching the glass surface and depleting the surface of silicon, oxygen, and boron.

Figure 5B:
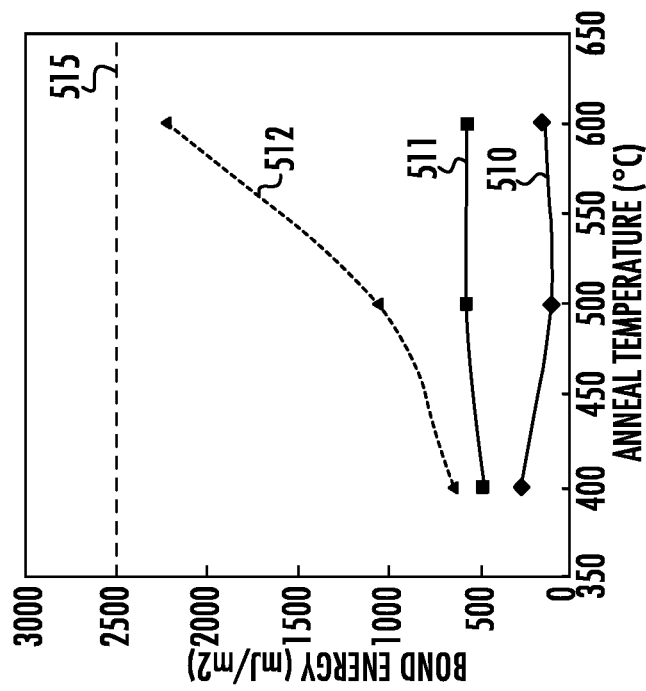
FIGS. 5A to 5B show the change in adhesion or bond energy as a function of the anneal temperature (FIG. 5A) and anneal time (FIG. 5B) for selected surface treatments.
Figure 5A:
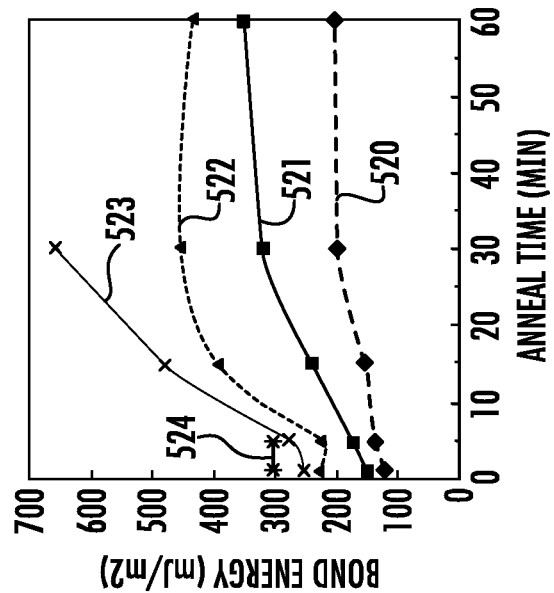

Changes in bond energy vs. anneal temperature and anneal time for $CF_4$ and $CHF_3$ plasma polymer treated Eagle XG® carrier bonded to SC1 cleaned thin glass is shown in FIG. 5A, and SC1 treated Eagle XG® carrier to SC1 treated thin glass is shown in FIG. 5B.

FIG. 5A shows the change in adhesion or bond energy as a function of the anneal temperature for RIE mode CF4 and CHF3 treated Eagle XG® carriers with three different surface energies prepared by changing the gas ratio as described in FIG. 2: at 40 mJ/m² surface energy (510) the bond energy is too weak and is inadequate for surviving low temperature polysilicon (LTPS) processing. At 55 mJ/m² surface energy (511) the bond energy is adequate to survive LPTS processing; and at 72 mJ/m² the surface energy (512) is still adequate for surviving LTPS processing but is more difficult to peel off the flexible glass sheet from the carrier. The bond energy (SE) or adhesion limit (515) is about 2500 mJ per square meter where attempted separation results in glass breakage failure.

FIG. 5B shows the bond energy (SE) of an SC1 treated Eagle XG® carrier to SC1 treated thin glass or adhesion of a flexible glass sheet to the carrier in the laminate as a function of anneal time at 100° C. (520), 150° C. (521), 200° C. (522), 250° C. (523) and 300° C. (524). Bond energy is observed to increase rapidly with increasing temperature. At 300° C. (524), the thin glass was permanently bonded and could not be removed without breakage at annealing times of 10 min and above.

Bond energy (BE) measurements were accomplished using the wedge test method (see Tong, Q. Y., et al. "Semiconductor Wafer Bonding", Annu Rev Mater Sci, vol. 28, no. 1, pp. 215-241, 1998). The bond energy or adhesion between a surface treated carrier and a clean flexible glass can be determined by inserting a thin blade and measuring the crack length. The bond energy γ is related to the carrier Young's modulus $E_1$, carrier thickness $t_{w1}$, flexible glass modulus $E_2$, flexible glass thickness $t_{w2}$, blade thickness $t_b$, and crack length L by the equation:

$$\gamma = \frac{3t_b^2 E_1 t_{w1}^3 E_2 t_{w2}^3}{16L^4(E_1 t_{w1}^3 + E_2 t_{w2}^3)}$$

From the examples in FIG. 5A it can be seen that creating a silicon and oxygen depleted and fluorine and carbon enhanced surface rich in alkaline earth fluorides by an inhomogeneous etching of glass surface optionally combined with polymer deposition can readily form temporary removable or releasable bonds to other high energy surfaces such as glass and in particular, thin glass.

In embodiments, a flexible glass sheet can have a thickness of from about 50 to about 300 microns, and a carrier glass article can have a of about 200 microns to 3 mm. Unexpectedly, this silicon and oxygen depleted and fluorine and carbon enriched surface does not permanently bond to glass surfaces at temperatures below about 600° C.

The surface treatments described herein may be used to process thin wafers in semiconductor and/or interposer processing. Some examples of the present invention are generally directed to carriers bonded to and removed from thinner substrates to allow processing of the thinner substrates. More particularly, some examples of the present invention are directed to methods and apparatuses for bonding wafers to carriers for semiconductor and/or interposer processing, and then debonding the wafers from the carriers after such processing.

Semiconductor devices are fabricated by forming active devices on or within a semiconductor wafer. The semiconductor wafer may comprise, for example, glass, silicon, polysilicon, single crystal silicon, silicon oxide, aluminum oxide, combinations of these, and/or the like. Hundreds or thousands of integrated circuits (ICs) or dies are typically manufactured on a single wafer. Typically, a plurality of insulating, conductive, and semiconductive material layers are sequentially deposited and patterned over the wafer to form the ICs. One of the uppermost-formed material layers typically comprises a layer for bond pads which make electrical connection to the underlying active areas and components within the wafer.

After the ICs are formed, the wafer may be subjected to backside processing. The backside processing may include thinning the wafer to prepare the wafer for packaging. For example, in some technologies, backside processing may include forming electrical connections to through-substrate vias formed through the wafer for providing backside contacts. In this example, the backside of the wafer is thinned through a process such as grinding in order to expose the conductive vias on the backside of the wafer. This process of thinning the wafer can damage the edges of the wafer and can make the wafer even more fragile and susceptible to damage during subsequent transportation and processing of the wafer.

To help alleviate these types of damage, a carrier may be attached to the wafer. Typically, before, this carrier was attached using an adhesive, and was intended to allow handling of the wafer by handling the carrier. Additionally, the added strength of the carrier supports the wafer so that stresses caused by transportation and/or processing will not damage the wafer. A typical carrier may be a glass substrate attached to the wafer using an adhesive. It has been found, however, that the wafer may warp during processing and that the typical carrier does not provide sufficient support to prevent warping. As a result of the warpage of the wafer, processes may fail and/or cause alarm conditions. The first portion of the IC fabrication, where the active transistors, resistors and RC circuits, and local wiring to interconnect the transistors are patterned in the semiconductor, is called front-end-of-line (FEOL) processing. FEOL processing may also include: well formation; gate module formation; source and drain module formation; DRIE (dry reactive ion etch); PVD, Ti or Cu, or other; CVD TiN or other; PECVD SiO2, or other; Electrolytic Cu (or other) Plating; Cu (or other) annealing; Metrology (X-Ray or other); Cu (or other) CMP (Chemical Mechanical Polish); Cu (H2O2+H2SO4)+Ti (DHF) Wet Etch; Sputter Adhesion Layer (Ti or other); Sputter Seed Layer (Cu or other); Lithography (Photoresist, expose, strip, etch Cu). Due to some of the high temperature (e.g., ≥500° C.,in some instances, 500° C. to 650° C., and in some cases up to 700° C.) processes associated with FEOL processing, many adhesive based solutions cannot be used, as they may fail to hold the bond, they may outgas contaminants, or both. Many adhesives even outgas at much lower temperatures, e.g., around 300° C. The portion of IC fabrication line where the coarse wiring that connects longer distances across individual chip and goes to off chip locations are interconnected with wiring on the wafer is called back-end-of-line (BEOL) wiring. BEOL processing may also include one or more of formation of contacts, insulating layers, interconnect wiring, RF shielding, passivation, ESD protection, bonding pads and other bonding sites for chip-to-package solutions. Although BEOL processing temperatures are generally lower than FEOL processing temperatures, dielectric deposition typically occurs at 350-450° C. and most adhesives outgas at these lower temperatures. Moreover, most temporary adhesives have high CTEs which are mismatched with the wafer and carrier materials, and are difficult to remove while leaving the delicate microstructures on the wafer intact. Additionally, the CTE mismatch between the adhesive and the wafer and/or carrier materials may cause undesirable warping of the wafer. Still further, adhesive may find its way into the vias of an interposer when bonding to a carrier and undesirably prevent metallization of at least part of the via.

Thus, there is a need for an improved carrier-substrate solution that can withstand processing conditions, particularly the high temperature demands of FEOL processing. Additionally, a carrier-substrate solution that can withstand the rigors of FEOL, and yet provide for easy debonding thereafter, will allow a thinner initial substrate to be used from the get-go, thereby alleviating the need for back-end thinning. That is, typical existing semiconductor tools are designed to process wafers on the order of 500 microns and above. However, with a carrier supporting a wafer, the combined thickness need only be within the tools' processing thickness range. Thus, for example, a carrier having a thickness of 400 microns may be used to support a wafer of 100 microns, and the combination processed in the existing semiconductor tool. With the present solution, due to the controlled bonding that allows easy separation even after high temperature processing, 100 micron wafers may be used as substrates, thereby avoiding the waste and potential yield reductions of thinning after forming devices on the wafer. The ability to withstand FEOL processing will allow a carrier-substrate solution to start with a wafer having a thickness of ≤200 microns, for example, 200, 190, 180, 170, 160, 150, 140, 130, 120, 110, 100, 90, 80, 70, 60, 50, 40, 30, or 20 microns. The wafer of such a thickness (≤200 microns for example) can be attached to a carrier, processed, and then removed from the carrier. This can be a major advantage when, for example, polysilicon or single crystal silicon wafers are used as the substrates because there can be avoided the removal and waste of a very expensive material; the material can simply be processed at its as-formed thickness.

Additionally, 3D IC technology has been widely accepted by the Semiconductor Industry as a major technology trend to improve performance of semiconductors without requiring ever more expensive advanced lithography solutions or requiring larger chip size to accommodate more circuitry. This technology for 3D ICs relies on thinned silicon ICs, and also on interposers to redistribute electrical signals between IC's directly on a single interposer in a planar configuration (2.5D IC) as well as to stack thinned IC's (3D IC).

These interposers, which can be made of polysilicon, single crystal silicon or glass, allow dramatic improvements in the speed of communications by reducing path lengths from millimeters to microns. The lead application for this new technology has been Field Programmable Gate Arrays (FPGA), a high end specialized functionality manufactured by Xilinx (San Jose, Calif., USA), for example.

Interposers are characteristically on the order of 50 um to 100 um thick, sized from 200 mm OD to 300 mm OD today, trending towards larger sized panels long term. The vias, through which electrical signals are processed following metallization, are from 5 um OD to 150 um OD with a density typically 1 to 20 vias per square millimeter, depending on design and application. Interposers are by definition thin, as thick interposers cause an unacceptable form factor (height) and performance (heat) obstacles. Thin is generally regarded as around 100 microns, but generally not to exceed 200 microns. On the other end, the International Technology Roadmap for Semiconductors (ITRS) allows for thicknesses down to 50 um. Again, substrates of these thicknesses generally cannot be processed in existing tools. Thus, the present disclosure contemplates the advantageous use of a carrier, and one that may stay attached with the wafer even during high temperature processing, and yet still allow an easy release of the wafer after such processing.

Although the interposer technology is new, the dominant interposer substrate is single crystal silicon, with glass emerging as an alternative. The attractiveness of glass is performance and cost, but no solution has yet existed today to realize these advantages for glass. The concepts in the present disclosure will allow processing of a variety of thin substrates as wafers, including silicon and glass, as well as under a variety of conditions, including FEOL and BEOL, to provide a variety of devices including ICs, RC circuits, and interposers.

The bonding solutions of the present disclosure allow the processing of thin form at final thickness glass, as well as thinned Silicon, through all existing required process steps with high yield and with low processing time. After the thin wafer is processed through metallization, distribution layer placement, it can be debonded leaving the thinned and processed interposer, and/or IC, intact. Moreover, the use of carrier with an already-thinned (on the order of ≤200 microns) silicon wafer allows the wafer to be screened before any devices are processed thereon. Accordingly, costs can be reduced and/or yields improved.

In light of the above, there is a need for a thin sheet—carrier article that can withstand the rigors of the FEOL processing, including high temperature processing (without outgassing that would be incompatible with the semiconductor or display making processes in which it will be used), yet allow the entire area of the thin sheet to be removed (either all at once, or in sections) from the carrier. The present specification describes surface treatments to control the adhesion between the carrier and thin sheet to create a temporary bond sufficiently strong to survive FEOL processing (including high temperature processing) but weak enough to permit debonding of the sheet from the carrier, even after high-temperature processing. More specifically, the present disclosure provides surface treatments that may be provided on the thin sheet, the carrier, or both, to control both room-temperature van der Waals, and/or hydrogen, bonding and high temperature covalent bonding between the thin sheet and carrier. Even more specifically, the room-temperature bonding may be controlled so as to be sufficient to hold the thin sheet and carrier together during vacuum processing, wet processing, and/or ultrasonic cleaning processing. And at the same time, the high temperature covalent bonding may be controlled so as to prevent a permanent bond between the thin sheet and carrier during high temperature processing, as well as maintain a sufficient bond to prevent delamination during high temperature processing.

Another use of the surface treatments, which form the temporary bonding condition, is to provide for use of a thin sheet on a carrier to process the thin sheet in processes requiring a temperature ≥400° C. (for example ≥450° C., ≥500° C., ≥550° C., ≥600° C.), as in FEOL processing, for example. That is, the thin sheet may be a wafer that is processed at thickness without having to thin it later on. Surface treatments as described herein may be used to provide reuse of the carrier under such temperature conditions. Specifically, these surface treatments may be used to form a temporary bond between the thin sheet and carrier, whereby the entire thin sheet may be separated from the carrier after processing. The thin sheet may be separated all at once, or may be separated in sections as, for example, when first removing devices produced on portions of the thin sheet and thereafter removing any remaining portions to clean the carrier for reuse, for example. In the event that the entire thin sheet is removed from the carrier, as by removal of the thin sheet as a whole, or as by removing diced sections of the thin sheet the sum of which add to the entire thin sheet, the carrier can be reused as is by simply by placing another thin sheet thereon. Alternatively, the carrier may be cleaned and once again prepared to carry a thin sheet by forming a surface treatment anew. Because the surface treatments provide a temporary bond between the thin sheet and the carrier, they may be used for processes wherein temperatures are ≥600° C. Of course, although these surface treatments may control bonding surface energy during processing at temperatures ≥600° C., they may also be used to produce a thin sheet and carrier combination that will withstand processing at lower temperatures, for example temperatures ≥400° C. (for example ≥450° C., ≥500° C., ≥550° C.), and may be used in such lower temperature applications to control bonding, for example in BEOL processing. The thin sheet may be a polysilicon or single crystal silicon wafer, silicon wafer, glass, ceramic, glass-ceramic, quartz, sapphire, having a thickness of ≤200 microns, and may be processed at, for example temperatures ≥500° C. to form RC circuits, ICs, or other electronic devices thereon in FEOL processing. After FEOL processing, the wafer may easily be removed from the carrier without damaging the electronic devices. Before removal, however, the wafer may undergo further, lower temperature processing, as in BEOL processing, for example.

A second use of the surface treatments, to provide a temporary bond, is to fabricate an interposer. In this case, the thin sheet is an interposer, which may be a wafer made from any suitable material including silicon, polysilicon, single crystal silicon, glass, ceramic, glass-ceramic, quartz, sapphire, for example, and which may have a thickness of ≤200 microns, for example.

An example of an interposer, and the fabrication thereof, will now be described with reference to FIGS. 6-8.

Figure 6:
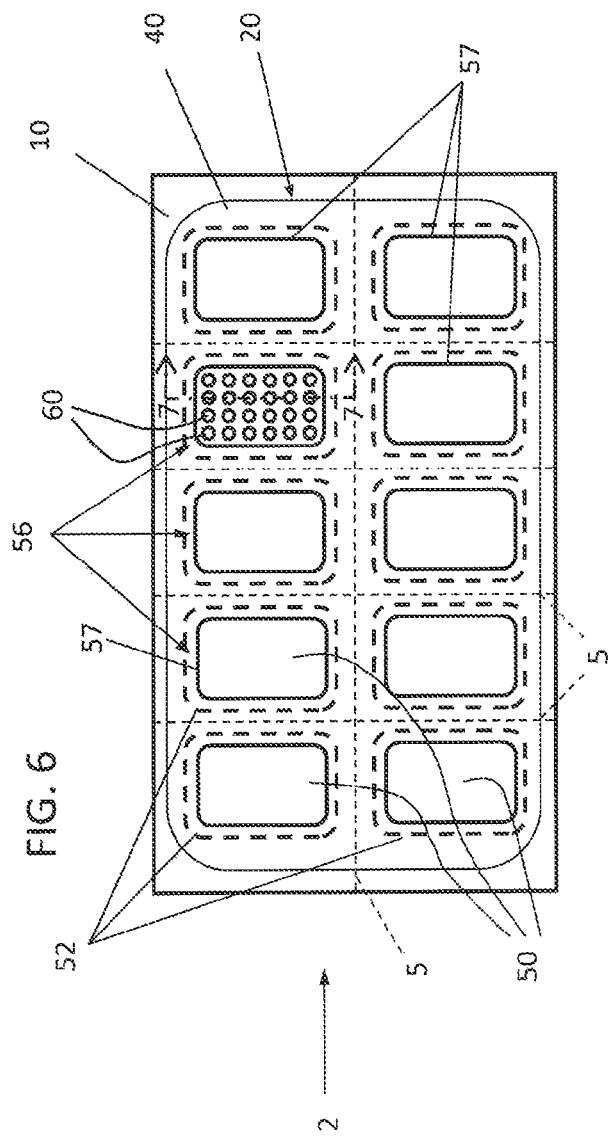
FIG. 6 is a top view of a thin sheet and carrier, having interposers.

With reference to FIG. 6, a thin sheet 20 may be bonded to a carrier 10 by a controlled bonding area 40, i.e., an area in which a temporary bond is formed between the thin sheet 20 and the carrier 10.

In this embodiment, the carrier 10, may be a glass substrate, or another suitable material having a similar surface energy as glass, for example, silicon, polysilicon, single crystal silicon, ceramic, glass-ceramic, sapphire, or quartz. An advantage of using a glass substrate is that flat sheets having minimal thickness variation can be obtained at a relatively low cost, avoiding the need for expensive carrier substrates. Additionally, with glass, a high quality can be achieved in a cost effective manner. That is, a very uniform thickness glass substrate can be made very cheaply, and used as a carrier. However, with the surface treatments of the present disclosure, the carrier need not be a high precision carrier having a low total thickness variation as in the case where the wafer will be thinned to final thickness. That is, when a wafer on a carrier will be thinned, the carrier must have a very tight control on total thickness variation because any variation in the carrier will be present in the thinned wafer upon thinning. With the surface treatments of the present disclosure, which allow forming devices on the wafer when the wafer is already at final thickness, the total thickness variation of the carrier is much less important.

In this embodiment, the thin sheet 20 is used to form interposers 56. The sheet may be silicon, including polysilicon or a single crystal silicon wafer, quartz, sapphire, ceramic, or glass, for example. The sheet 20 may have a thickness of ≤200 microns. The interposers 56 each having a perimeter 52 and an array 50 of vias, wherein the array 50 has a perimeter 57. Although ten interposers 56 are shown, any suitable number—including one—may be disposed on one thin sheet 20. For convenience of illustration, each interposer 56 is shown as having only one array 50 of vias, but such need not be the case; instead any interposer 56 may have more than one array 50. Further, although each interposer is shown as having the same number of arrays 50, such need not be the case; any number (including zero) of the interposers may have the same number of arrays 50. Additionally, although the arrays 50 will typically have the same number and pattern of vias, such need not be the case. For convenience of illustration, vias 60 are shown on only one of the arrays 50 of one of the interposers 56, but such need not be the case, i.e., any one or more of the remaining interposers 56 may have one or more arrays 50 of vias 60.

Figure 7:
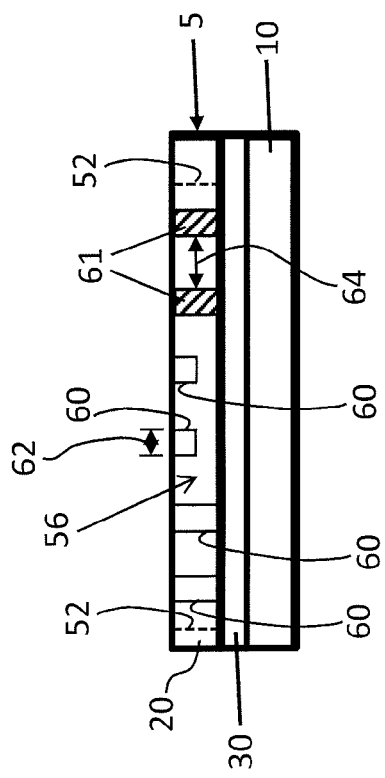
FIG. 7 is a cross-sectional view of the thin sheet and carrier as taken along line 7-7 of FIG. 6.

Reference will now be made to FIG. 7, which is a cross-sectional view as taken along line 7-7 in FIG. 6. The vias 60 may include through vias or blind vias, i.e., vias that end within the thickness of the sheet 20. Vias 60 have a diameter 62, and are spaced at a pitch 64. Although the diameters 62 are shown as being the same, such need not be the case, i.e., there may be different diameter vias in one array 50 or in different arrays 50 on one interposer 56. The diameter 62 may be from 5 microns to 150 microns, for example. Similarly, although the vias 62 are spaced at the same pitch 64, such need not be the case, i.e., different pitches may be present in one array 50, or in different arrays 50 on one interposer 56 or in different interposers 56 on one thin sheet 20. The pitch may be such that there are from 1 to 20 vias per square millimeter, for example, and will depend upon the design and application of the interposer.

Additionally, material 61 may be present in any one or more of the vias 60. The material 61 may be an electrically conductive material, an electrically insulating material, or a combination thereof. For example, a conductive material may be formed on the perimeter of the via, i.e., at its outside diameter 62, and either a different conductive material or an insulating material may be used to fill in the remainder of the via.

Figure 8:
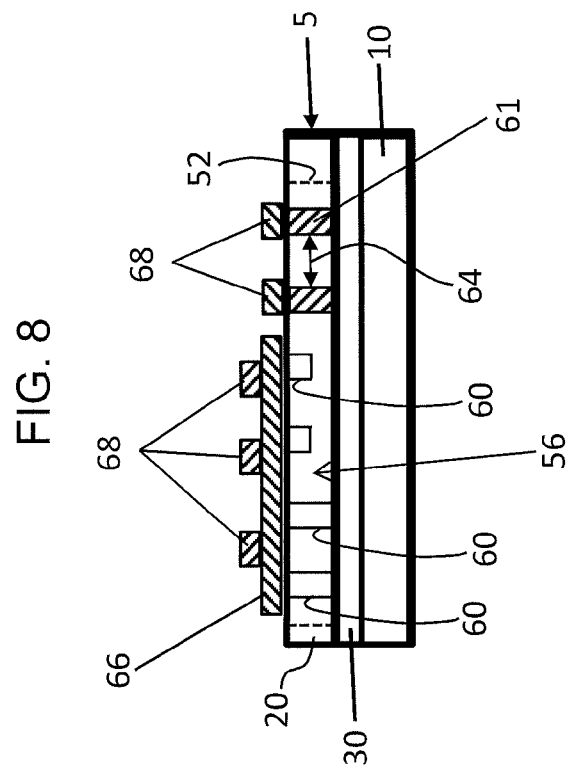
FIG. 8 is a cross-sectional view, similar to that in FIG. 20, but having additional devices disposed on the thin sheet.

Reference will now be made to FIG. 8, which is a view similar to that in FIG. 7, but with devices/structures disposed on the interposer 56 and connected to via(s) 60. As shown in FIG. 8, a device 66 may be disposed over, and connected with, a plurality of vias 60. Device 66 may include integrated circuits; MEMS; microsensors; power semiconductors; light-emitting diodes; photonic circuits; CPU; SRAM; DRAM, eDRAM; ROM, EEPROM; flash memory; interposers; embedded passive devices; and microdevices fabricated on or from silicon, silicon-germanium, gallium arsenide, and gallium nitride. Although only one device 66 is shown, there may be any suitable number of devices 66 on one interposer 56, including an array of devices 56. Alternatively, a structure 68 may be disposed over and connected with only one via 60. Structures 68 may include: solder bumps; metal posts; metal pillars; interconnection routings; interconnect lines; insulating oxide layers; and structures formed from a material selected from the group consisting of silicon, polysilicon, silicon dioxide, silicon (oxy)nitride, metal (for example, Cu, Al, W), low k dielectrics, polymer dielectrics, metal nitrides, and metal silicides. Although only one structure 68 is shown, there may be any suitable number of structures 68 on one interposer 56, including array(s) of structures 56. Further, one or more structures 68 may be disposed on a device 66.

In the controlled bonding area 40, the carrier 10 and thin sheet 20 are bonded to one another so that over the entire area of overlap, the carrier 10 and thin sheet 20 are connected, but may be separated from one another, even after high temperature processing, e.g. processing at temperatures ≥400° C., for example ≥450° C., ≥500° C., ≥550° C., ≥600° C., and on up to about 650° C., or in some cases to 700° C.

The surface treatments disclosed herein result in an interfacial bonding layer 30 to provide temporary bonding areas 40 between the carrier 10 and the thin sheet 20. Specifically, these surface treatments may be formed within the perimeters 52 of the arrays 50 either on the carrier 10 or on the thin sheet 20. Accordingly, when the article 2 is processed at high temperature during device processing, there can be provided a temporary bond between the carrier 10 and the thin sheet 20 within the areas bounded by perimeters 52 whereby a separation force may separate (without catastrophic damage to the thin sheet or carrier) the thin sheet and carrier in this region, yet the thin sheet and carrier will not delaminate during processing, including ultrasonic processing. Additionally, because of the very small thickness of the interfacial bonding layer 30, i.e., less than 100 nanometers, less than 40 nanometers, less than 10 nanometers, and in some instances about 2 nanometers, there is no effect on the wafer due to CTE mismatch between the wafer and the surface treatment (as there is in the case of thicker adhesive layers, i.e., on the order of 40-60 microns or more).

Then, during extraction of the interposers 56 (each having an array 50 of vias 60) having perimeters 52, the portions of thin sheet 20 within the perimeters 52 may simply be separated from the carrier 10 after processing and after separation of the thin sheet along perimeters 52. Alternatively, the thin sheet 20 (and alternatively both the thin sheet 20 and the carrier 10) may be diced along lines 5, whereby a section of the thin sheet 20 larger than the interposer 56 perimeter 52 may be removed from the carrier 10, or sections of the carrier 10 as in the event that the carrier is diced together with the thin sheet 20. Because the surface treatments provide temporary bonding of the thin sheet with the carrier, they may be used for processes wherein temperatures are ≥600° C. Of course, although these surface treatments may control bonding surface energy during processing at temperatures ≤600° C., they may also be used to produce a thin sheet and carrier combination that will withstand processing at lower temperatures for example ≥400° C. (for example ≥450° C., ≥500° C., ≥550° C.), and may be used in such lower temperature applications.

In embodiments, the sheet 20 comprises silicon, quartz, sapphire, ceramic, or glass.

In embodiments, the sheet 20 thickness is ≥200 microns.

In embodiments, the sheet 20 further comprises at least one via therein. In embodiments, the at least one via has a diameter of ≥150 microns. In embodiments, the at least one via may comprise electrically conductive material therein.

In embodiments, the sheet 20 comprises a device surface opposite the surface temporarily bonded to the carrier 10, the device surface comprising an array of devices selected from the group consisting of: integrated circuits; MEMS; CPU; microsensors; power semiconductors; light-emitting diodes; photonic circuits; interposers; embedded passive devices; and microdevices fabricated on or from silicon, silicon-germanium, gallium arsenide, and gallium nitride.

In embodiments, the sheet 20 comprises a device surface opposite the surface temporarily bonded to the carrier 10, the device surface comprising at least one structure selected from the group consisting of: solder bumps; metal posts; metal pillars; interconnection routings; interconnect lines; insulating oxide layers; and structures formed from a material selected from the group consisting of silicon, polysilicon, silicon dioxide, silicon (oxy)nitride, metal, low k dielectrics, polymer dielectrics, metal nitrides, and metal silicides.

In embodiments, the interfacial bonding layer 30 is from 0.1 to 100 nm thick.

In embodiments, the carrier and the sheet are temporarily bonded over an area of ≥100 square cm.

In embodiments, the sheet 20 and carrier 10 temporarily bonded together are subject to FEOL processing. In embodiments, the FEOL processing comprises processing-chamber temperatures of from 500° C. to 700° C. In embodiments, the FEOL processing comprises at least one of: DRIE (dry reactive ion etch); PVD; CVD TiN; PECVD SiO2; Electrolytic Cu Plating; Cu Annealing; Metrology; Cu CMP; Cu (H2O2+H2SO4)+Ti (DHF) Wet Etch; Sputter Adhesion Layer; Sputter Seed Layer; Lithography (Photoresist, expose, strip, etch Cu).

EXAMPLES

The following Examples demonstrate making, use, and analysis of the disclosed laminate glass products in accordance with the above general procedures. The following Examples also demonstrate an ability to control the resulting strength of the interfacial bond between the component pieces in the laminate article.

Example 1

Carrier Cleaning The carrier can be cleaned prior to use in the disclosed process, after use in the disclosed process following debonding or separation of the glass work piece, or both. The cleaning step can include, for example, one or more of: DI water rinse, $NH_4OH:H_2O_2:H_2O$ mixture, $O_2$ plasma treatment, an acid rinse (i.e., HCl or $HCl:H_2O_2$) and like rinses, or a combination thereof. The cleaning step is primarily concerned with significantly minimizing the density of particles on the cleaned surface.

Example 2

Surface Treatment In an additive surface treatment process of the disclosure, the surface of the carrier or the glass work piece can be modified to permit van der Waal bonding while eliminating or minimizing covalent bonding. The treated surface provides adhesive stability between the carrier and the work piece up to moderate process temperatures (e.g., 600° C.). The surface treatment can be accomplished with a fluorine plasma having process conditions of, for example, a vacuum pressure of 50 mTorr, a reactant flow rate and concentration of 25 sccm $CHF_3$ and 25 sccm $CF_4$, a 200W RF power, and a 60 second fluorine plasma exposure or treatment time. Alternatively, a similar surface may be prepared in an ICP plasma configuration with $CF_4$ as the etchant and $C_4F_8$ as the fluoropolymer former, or in an RIE chamber with $CF_4$ as the etchant and $CH_4$ as the fluoropolymer former, or in an RIE chamber with $CF_4$ as the etchant and $H_2$ as the polymer former.

In another example, the counterpart work piece to be bonded can be, for example, a semiconductor substrate or a substrate for epitaxial growth, such as silicon, gallium arsenide, or sapphire. These substrates bond to the treated carrier glass similar to the thin glass substrate described above by either hand bonding or roller lamination. The adhesion of these substrate materials was similar to that of the above glass substrates, both as bonded and after thermal processing.

Example 3

Bonding a thin glass work piece to a carrier substrate. In an example bonding procedure, a thin glass work piece was lightly contacted with a carrier surface that had been treated with any of the treatments in the preceding example. Contacting pressure, for example, from a mechanical source, or like source, can be applied to one or more points on either or both the thin glass work piece and the carrier. The lightly applied pressure can initiate a bonding wave front.

In another example bonding procedure, the bond can be accomplished by a traditional mechanical lamination method by, for example, applying an untreated or treated thin glass work piece to a treated carrier with a roller lamination assembly.

Example 4

Device (e.g., Flat Panel Display) Fabrication on the Bonded Thin Glass Work Piece Device processing, that is, creation, fabrication, modification, etc., can be accomplished on the exterior and unbounded surface of the bonded thin glass work piece using conventional process techniques such that devices, circuits, or like structural or surface modification of the non-bonded thin glass work piece surface occurs. Device processing can include, for example, exposure to acids, bases, vacuum, film deposition, plasma etching, high temperature annealing vacuum, and like processing steps.

Example 5

Debonding Debonding processing permits the bonded thin glass work piece, now having the device processed outer surface, i.e., the device modified glass substrate, to be mechanically and relatively easily removed from the carrier substrate. Removal from the carrier can be accomplished by any suitable device or method, for example, grabbing a corner using vacuum suction and pulling on the bonded thin glass work piece to remove it from the carrier by, for example, peeling.

Example 6

XPS method of determining surface composition. X-ray Photoelectron Spectroscopy (XPS) was used to study and measure the surface composition and speciation of all surfaces. All XPS data were collected using a commercial XPS instrument (PHI) employing AlKα radiation and a take off angle of 45°. The spectra were analyzed using the software and sensitivity factors provided by the XPS instrument vendor. The following orbitals were used to determine the surface composition: Si 2p, Al 2p, O 1s, C 1s, Mg 2s, Ca 2s, B 1s, F 1s, and Sr 3d. The reported concentrations of these elements were averages of concentrations of each of these elements over the entire probed depth of the XPS signal.

Example 7

Changes in surface composition as a function of $CHF_3$ (fluoropolymer forming agent) and $CF_4$ (etchant) ratio Table 1 shows the surface atomic ratios of select elements obtained from FIG. 4 (Al:Si, Ca:Si, Mg:Si, Sr:Si) for untreated EXG glass and EXG glass following plasma treatment in different ratios of $CF_4$ and $CHF_3$. The data clearly show that plasma surface treatment results in substantial increase in the Al:Si, Ca:Si, Mg:Si, and Sr:Si atomic ratios for the treated EXG surfaces as compared to untreated EXG surface, which results are indicative of the relative depletion of Si compared to Al, Ca, Mg, and Sr.

TABLE 1

Atomic ratios of selected elements obtained from FIG. 4 compared with the same ratios in the surface composition of untreated EXG.

| $CF_4/(CF_4 + CHF_3)$ | Al:Si | Ca:Si | Mg:Si | Sr:Si |
|---|---|---|---|---|
| 0 (i.e., 100 mol % $CHF_3$) | 1.9 | 1.1 | 0.3 | 0.07 |
| 0.2 | 1.9 | 1.3 | 0.3 | 0.08 |
| 0.4 | 2.0 | 1.5 | 0.3 | 0.07 |
| 0.6 | 2.4 | 1.6 | 0.4 | 0.08 |
| 0.8 | 2.5 | 1.6 | 0.4 | 0.10 |
| 1 (i.e., 100 mol % $CF_4$) | 2.4 | 1.6 | 0.4 | 0.10 |
| EXG no treatment control | 0.26 | 0.10 | 0.01 | 0.01 |

The presence of a carbonaceous overlayer is known to affect the atomic ratios of the underlying elements due to selective attenuation of XPS signal originating from different orbitals. In the ratio of Ca:Si, the changes due to measurement artifact is small and in the ratios of Al:Si, Mg:Si, and Sr:Si, these changes are minimal and essentially below detection limits.

Example 8

Determination of Formation of Fluoride Species on Glass Surface XPS was also used to perform speciation of fluorine detected on the surfaces. The F is spectra could be peak fitted with two distinct peaks separated by about 1.9 eV. The lower binding energy peak was assigned to fluorine present as metal fluoride species while the higher binding energy peak was assigned to fluorine in reaction with the carbonaceous layer. In this manner it is possible to obtain the fraction of fluorine concentration detected on the surface by XPS which is due to metal fluorides and the fraction of fluorine present in the fluoropolymer layer.

Knowing the concentration of fluorine that is in the form of metal fluorides, and knowing the total concentration of cations detected by XPS, it is possible to calculate the total fluorine to cation ratio. In this instance, total cation concentration is defined as the total concentrations of B, Al, Mg, Sr, Si, and Ca as detected by XPS under conditions defined in Example 7. The results of such analysis for the examples of pure $CHF_3$ and pure $CF_4$ plasma conditions are presented in Table 2.

The results in Table 2 indicate that for the example of pure $CHF_3$ a majority of fluorine concentration detected by XPS on the surface is in the form of fluoropolymer while in the example of pure CF4, a minority of the fluorine concentration detected by XPS is in the form of fluoropolymer.

TABLE 2

Total concentration of fluorine detected on the surface, the total portion of fluorine present as metal fluorides, and the fluorine to glass cations ratios for pure $CHF_3$ or pure $CF_4$ plasma compositions.

| | 50 sccm $CHF_3$ 50 mTorr | | | 50 sccm $CF_4$ 50 mTorr | | |
|---|---|---|---|---|---|---|
| time (sec) | Total surface F (at %) | total F as metal fluoride (at %) | F:cation ratio for glass | Total surface F (at %) | total F as metal fluorides (at %) | F:cation ratio for glass |
| 60 | 48.5 | 14.2 | 2.2 | 52.4 | 50.9 | 2.3 |

The disclosure has been described with reference to various specific embodiments and techniques. However, it should be understood that many variations and modifications are possible while remaining within the scope of the disclosure.

What is claimed is:

1. A laminate glass article, comprising:
a glass device substrate bonded to a glass carrier substrate with at least one interfacial bonded surface that has been treated with a plasma selected from:
a fluoropolymer;
the reaction products of a fluorinated etching agent;
or a combination thereof,
wherein the interfacial bond strength between the glass device substrate and the glass carrier substrate is from about 100 to about 1,000 $mJ/m^2$, the interface between the glass device substrate and the glass carrier substrate has a silicon content of from about 0.1 to about 14 at %; a fluorine content of from about 5 to 65 at %, and a metal to fluorine (M:F) atomic ratio of about 1:1 to 1:3.

2. The article of claim 1 wherein the glass device substrate has a thickness of from about 20 to about 500 microns, the glass carrier substrate has a thickness of about 200 micron to about 3 mm, and the thickness of the interfacial bonding layer between the glass device substrate and the glass carrier substrate is from about a single atomic layer to about 100 nanometer.

3. The article of claim 1 further comprising the non-bonded second surface of the glass device substrate in the laminate article has at least one device modified surface area.

4. The article of claim 1 wherein the glass device substrate has a plurality of holes therein.

* * * * *

UNITED STATES PATENT AND TRADEMARK OFFICE
CERTIFICATE OF CORRECTION

PATENT NO. : 11,192,340 B2
APPLICATION NO. : 16/732845
DATED : December 7, 2021
INVENTOR(S) : Adib et al.

It is certified that error appears in the above-identified patent and that said Letters Patent is hereby corrected as shown below:

On the Title Page

On page 5, in Column 2, item (56), Other Publications, Line 2, delete "fromPCT" and insert -- from PCT --.

On page 5, in Column 2, item (56), Other Publications, Line 5, delete "Biedermam;" and insert -- Biederman; --.

On page 5, in Column 2, item (56), Other Publications, Line 33, delete "(1986." and insert -- (1986). --.

On page 6, in Column 1, item (56), Other Publications, Line 25, delete "(2002." and insert -- (2002). --.

On page 6, in Column 1, item (56), Other Publications, Line 40, delete "Cyloaddition";" and insert -- Cycloaddition"; --.

On page 6, in Column 1, item (56), Other Publications, Line 45, delete "Perfluororelastomer" and insert -- Perfluoroelastomer --.

On page 6, in Column 1, item (56), Other Publications, Line 55, delete "(1971." and insert -- (1971). --.

On page 6, in Column 2, item (56), Other Publications, Line 20, delete "Copyrgt." and insert -- Copyright --.

On page 6, in Column 2, item (56), Other Publications, Line 25, delete "Writien" and insert -- Written --.

On page 6, in Column 2, item (56), Other Publications, Line 28, delete "Writien" and insert Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,192,340 B2

-- Written --.

On page 6, in Column 2, item (56), Other Publications, Line 32, delete "Aurthority;" and insert -- Authority; --.

On page 6, in Column 2, item (56), Other Publications, Line 35, delete "Aurthority;" and insert -- Authority; --.

On page 6, in Column 2, item (56), Other Publications, Line 44, delete "Irfrared" and insert -- Infrared --.